United States Patent
Shin

(10) Patent No.: US 8,748,945 B2
(45) Date of Patent: Jun. 10, 2014

(54) IMAGE SENSORS INCLUDING A GATE ELECTRODE SURROUNDING A FLOATING DIFFUSION REGION

(75) Inventor: Jong-Cheol Shin, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 70 days.

(21) Appl. No.: 13/367,599

(22) Filed: Feb. 7, 2012

(65) Prior Publication Data

US 2012/0199882 A1    Aug. 9, 2012

(30) Foreign Application Priority Data

Feb. 7, 2011 (KR) .................. 10-2011-0010725

(51) Int. Cl.
*H01L 29/768* (2006.01)

(52) U.S. Cl.
USPC ........... 257/222; 257/219; 257/225; 257/233; 257/239; 257/240; 257/241; 257/246

(58) Field of Classification Search
USPC ......... 257/222, 233, 219, 225, 239, 240, 241, 257/246
See application file for complete search history.

(56) References Cited

U.S. PATENT DOCUMENTS 7,235,826 B2    6/2007    Ezaki et al.
2007/0052056 A1*  3/2007   Doi et al. .................. 257/462

FOREIGN PATENT DOCUMENTS

| JP | 2005-223084 | 8/2005 |
| KR | 1020040036049 | 4/2004 |
| KR | 1020050103782 | 11/2005 |
| KR | 1020060041633 | 5/2006 |

* cited by examiner

*Primary Examiner* — Long K Tran
(74) *Attorney, Agent, or Firm* — Myers Bigel Sibley & Sajovec, PA

(57) ABSTRACT

Image sensors are provided. The image sensors may include first and second stacked impurity regions having different conductivity types. The image sensors may also include a floating diffusion region in the first impurity region. The image sensors may further include a transfer gate electrode surrounding the floating diffusion region in the first impurity region. Also, the transfer gate electrode and the floating diffusion region may overlap the second impurity region.

16 Claims, 25 Drawing Sheets

IMAGE SENSORS INCLUDING A GATE ELECTRODE SURROUNDING A FLOATING DIFFUSION REGION

CROSS-REFERENCE TO RELATED APPLICATIONS

This U.S. non-provisional patent application claims priority under 35 U.S.C. §119 to Korean Patent Application No. 10-2011-0010725, filed on Feb. 7, 2011, the disclosure of which is hereby incorporated by reference in its entirety.

BACKGROUND

The present disclosure herein relates to semiconductor devices and, more particularly, to image sensors.

An image sensor is a device that converts optical images into electrical signals. With increased development of the computer and communications industries, there may be an increased demand for high performance image sensors that may be used for capturing images in a variety of applications such as digital cameras, camcorders, personal communication systems (PCS's), gaming machines, security cameras, micro-cameras for medical applications, and/or robots.

Image sensors may include complementary metal-oxide-semiconductor (CMOS) image sensors and charge coupled devices (CCDs). CMOS image sensors operate with a simple driving manner/way and may be integrated with signal processing circuits on a single chip, thus enabling products that include the CMOS image sensors to be scaled down. In addition, CMOS image sensors may operate with relatively low power consumption. Thus, CMOS image sensors are applicable to portable electronic devices. Furthermore, CMOS image sensors may be fabricated using CMOS fabrication techniques, which may reduce manufacturing costs. Moreover, CMOS image sensors may provide high resolution images. Accordingly, the use of CMOS image sensors has increased.

SUMMARY

According to some embodiments, image sensors may include first and second stacked impurity regions having different conductivity types. The image sensors may also include a floating diffusion region in the first impurity region. The image sensors may further include a transfer gate electrode surrounding the floating diffusion region in the first impurity region, the transfer gate electrode and the floating diffusion region overlapping the second impurity region.

In some embodiments, a portion of the first impurity region may be configured to provide a channel region of a charge transmission element.

Some embodiments provide that the transfer gate electrode may be substantially centered with respect to the second impurity region in a plan view.

In some embodiments, the first and second impurity regions may provide a photoelectric conversion device. Additionally, first and second distances from the transfer gate electrode to respective first and second edges of the photoelectric conversion device may be substantially equal.

Some embodiments provide that the transfer gate electrode may downwardly extend into the lower impurity region such that a bottom surface of the transfer gate electrode is lower than a top surface of the lower impurity region.

In some embodiments, the first and second impurity regions may share a boundary therebetween. Also, the transfer gate electrode may be spaced apart from the boundary that is between the first and second impurity regions.

Some embodiments provide that the first and second impurity regions may provide a photoelectric conversion device. Also, the transfer gate electrode may extend primarily vertically. Moreover, the transfer gate electrode may be substantially centered with respect to the photoelectric conversion device in a plan view.

In some embodiments, the image sensors may further include a local impurity region adjacent the transfer gate electrode. The local impurity region may have the same conductivity type as the first impurity region. Also, the local impurity region may have an impurity concentration higher than that of the first impurity region.

Some embodiments provide that the first impurity region may further include first and second layers having different impurity concentrations. The floating diffusion region may be in the first layer. Also, the transfer gate electrode may be in the first and second layers.

In some embodiments, the transfer gate electrode may have a closed-loop shape around the floating diffusion region.

Some embodiments provide that the first impurity region may include a surface impurity region. The first impurity region may further include an electric potential barrier region between the surface impurity region and the second impurity region. The surface impurity region may have an impurity concentration higher than that of the electric potential barrier region.

According to some embodiments, image sensors may include a charge storage layer configured to store charges generated in response to incident light. The image sensors may also include an electric potential barrier layer on the charge storage layer, the electric potential barrier layer having a different conductivity type from the charge storage layer. The image sensors may further include a charge detecting layer in the electric potential barrier layer, the charge detecting layer having a different conductivity type from the electric potential barrier layer and being vertically spaced apart from the charge storage layer. The image sensors may additionally include a gate electrode having a closed-loop shape that surrounds the charge detecting layer. Also, the gate electrode may be configured to control a potential of the electric potential barrier layer to transmit charges in the charge storage layer to the charge detecting layer.

In some embodiments, the charge storage layer may include a central portion surrounded by the gate electrode and a peripheral portion adjacent an outer sidewall of the gate electrode in a plan view. Also, the image sensors may further include a surface impurity layer over the peripheral portion of the charge storage layer. Moreover, the surface impurity layer may have the same conductivity type as the electric potential barrier layer and may surround an outer sidewall of the gate electrode. Furthermore, the surface impurity layer may have an impurity concentration higher than that of the electric potential barrier layer.

Some embodiments provide that the electric potential barrier layer on the central portion of the charge storage layer may extend onto the peripheral portion of the charge storage layer across a region under the gate electrode.

In some embodiments, a bottom surface of the gate electrode may be located at a level between the charge detecting layer and the charge storage layer.

According to some embodiments, image sensors may include a semiconductor layer including first and second opposing surfaces. The image sensors may also include an interconnection layer on the first surface of the semiconductor layer, the interconnection layer including read gate electrodes and interconnections. The image sensors may further include a light transmission layer on the second surface of the semiconductor layer, the light transmission layer including color filters and micro lenses. The image sensors may additionally include a gate electrode inside the semiconductor layer and directly adjacent the first surface of the semiconductor layer, the gate electrode having a closed-loop shape. Moreover, the semiconductor layer may include a charge storage layer configured to store charges generated in response to incident light. The semiconductor layer may also include a channel layer contacting the charge storage layer and being directly adjacent the first surface of the semiconductor layer, the channel layer having an opposite conductivity type to the charge storage layer. The semiconductor layer may further include a charge detecting layer in the channel layer and vertically spaced apart from the charge storage layer, the charge detecting layer having the same conductivity type as the charge storage layer. Moreover, the gate electrode may be inside the channel layer.

In some embodiments, the image sensors may further include a local impurity region adjacent a bottom surface of the gate electrode. The local impurity region may have the same conductivity type as the channel layer. Also, the local impurity region may have an impurity concentration higher than that of the channel layer.

Some embodiments provide that the channel layer may include an inner region surrounded by the gate electrode. The channel layer may also include an outer region adjacent an outer sidewall of the gate electrode.

In some embodiments, the image sensors may further include metal oxide semiconductor (MOS) transistors overlapping the charge storage layer in a plan view. Additionally, the MOS transistors may be configured to use the outer region of the channel layer as channel regions.

Some embodiments provide that the charge detecting layer may be surrounded by the gate electrode.

BRIEF DESCRIPTION OF THE DRAWINGS

The above and other features and advantages of the disclosure will become more apparent in view of the attached drawings and accompanying detailed description.

DETAILED DESCRIPTION

Figure 1:
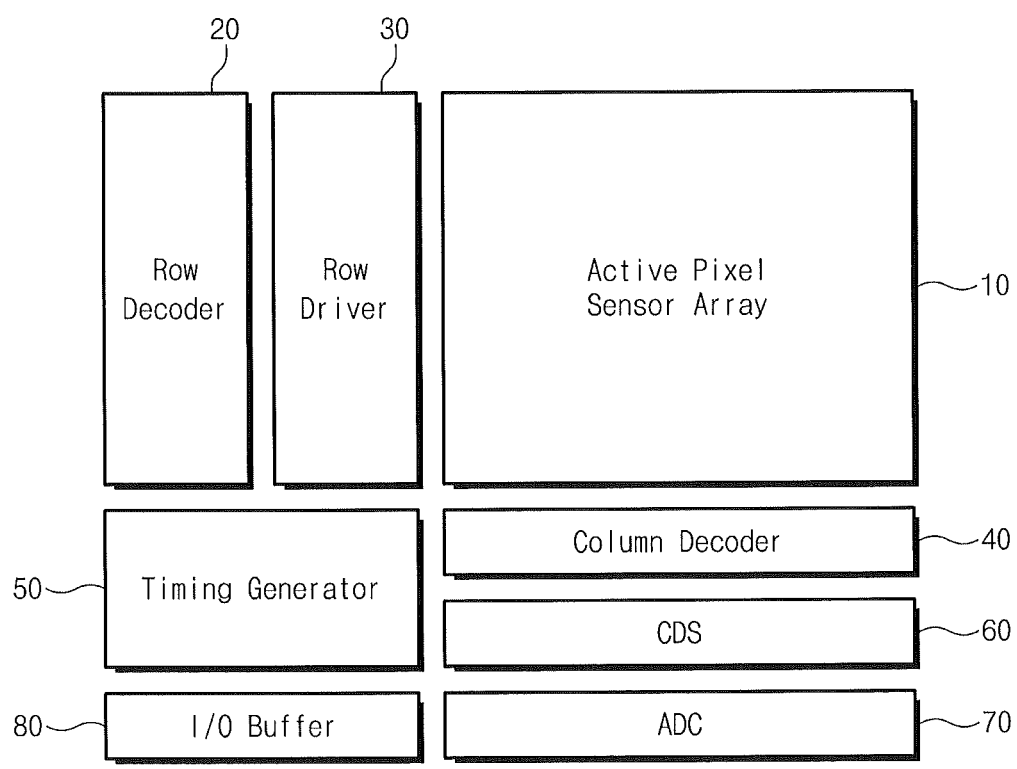
FIG. 1 is a schematic block diagram illustrating a CMOS image sensor according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram illustrating a CMOS image sensor according to some embodiments.

Referring to FIG. 1, the CMOS image sensor includes an active pixel sensor (APS) array 10, a row decoder 20, a row driver 30, a column decoder 40, a timing generator 50, a correlated double sampler (CDS) 60, an analog to digital converter (ADC) 70, and an input/output (I/O) buffer 80.

The active pixel sensor array 10 includes a plurality of unit pixels, which may be arranged two-dimensionally. The active pixel sensor array 10 converts optical signals into electrical signals. The active pixel sensor array 10 may be driven by a plurality of driving signals such as a pixel selection signal, a reset signal, and a charge transmission signal from the row driver 30. The converted electric signals are supplied to the correlated double sampler 60.

The row driver 30 supplies several driving signals for driving several unit pixels to the active pixel sensor array 10 in accordance with the decoded result obtained from the row decoder 20. For example, when the unit pixels are arranged in a matrix shape, the driving signals may be supplied to the respective rows.

The timing generator 50 supplies a timing signal and a control signal to the row decoder 20 and the column decoder 40.

The correlated double sampler (CDS) 60 receives the electrical signals generated in the active pixel sensor array 10, and holds and samples the received electrical signals. The correlated double sampler 60 may perform double sampling on a specific noise level and a signal level of an electrical signal to output a difference level corresponding to a difference between the noise level and the signal level.

The analog to digital converter (ADC) 70 converts analog signals corresponding to the difference level output from the correlated double sampler 60 into digital signals, and then the analog to digital converter 70 outputs the converted digital signals.

The I/O buffer 80 latches the digital signals and sequentially outputs the latched signals to an image signal processing unit in accordance with the decoding result obtained from the column decoder 40.

Figure 2A:
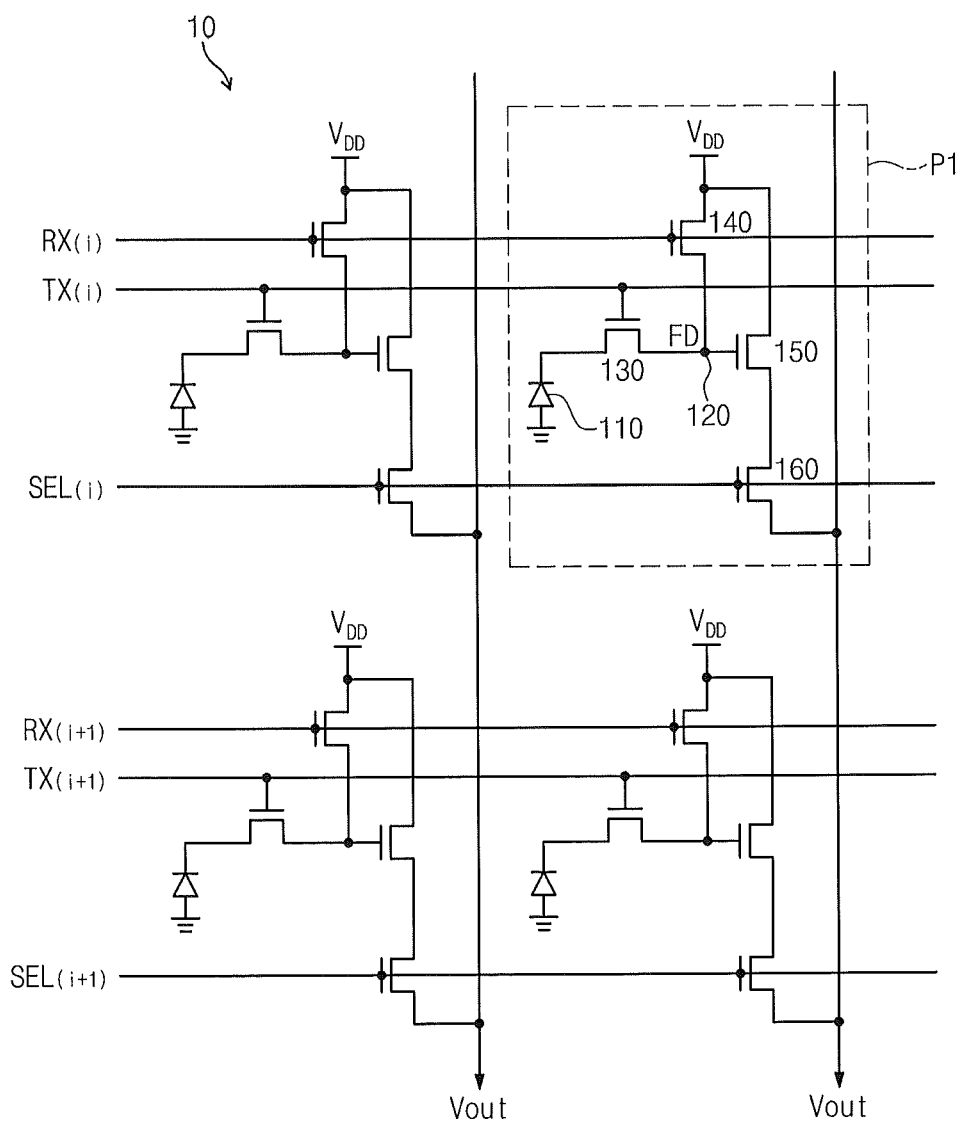
FIGS. 2A to 2C are equivalent circuit diagrams illustrating active pixel sensor arrays of CMOS image sensors according to some embodiments.
Figure 2B:
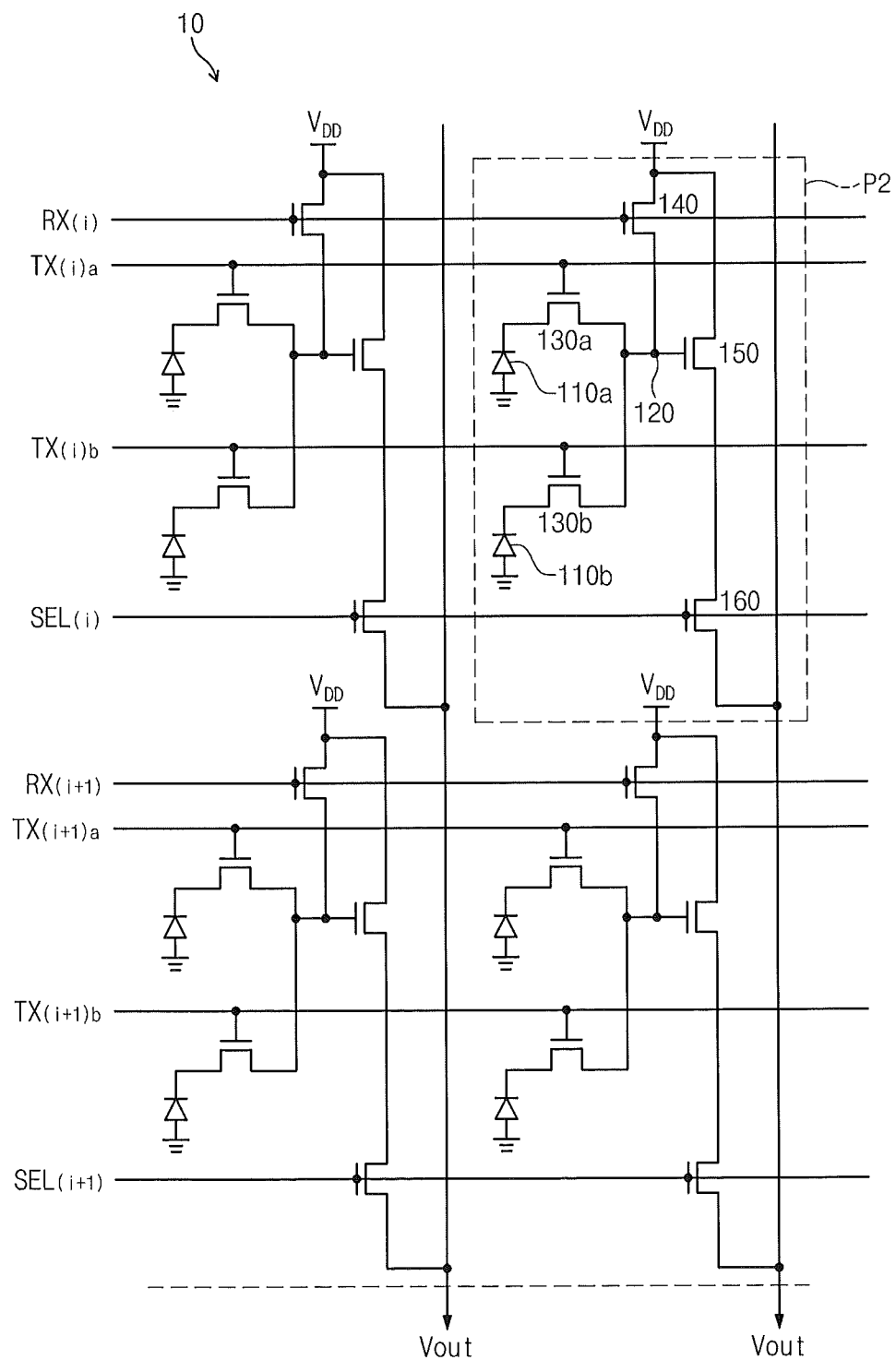
Figure 2C:
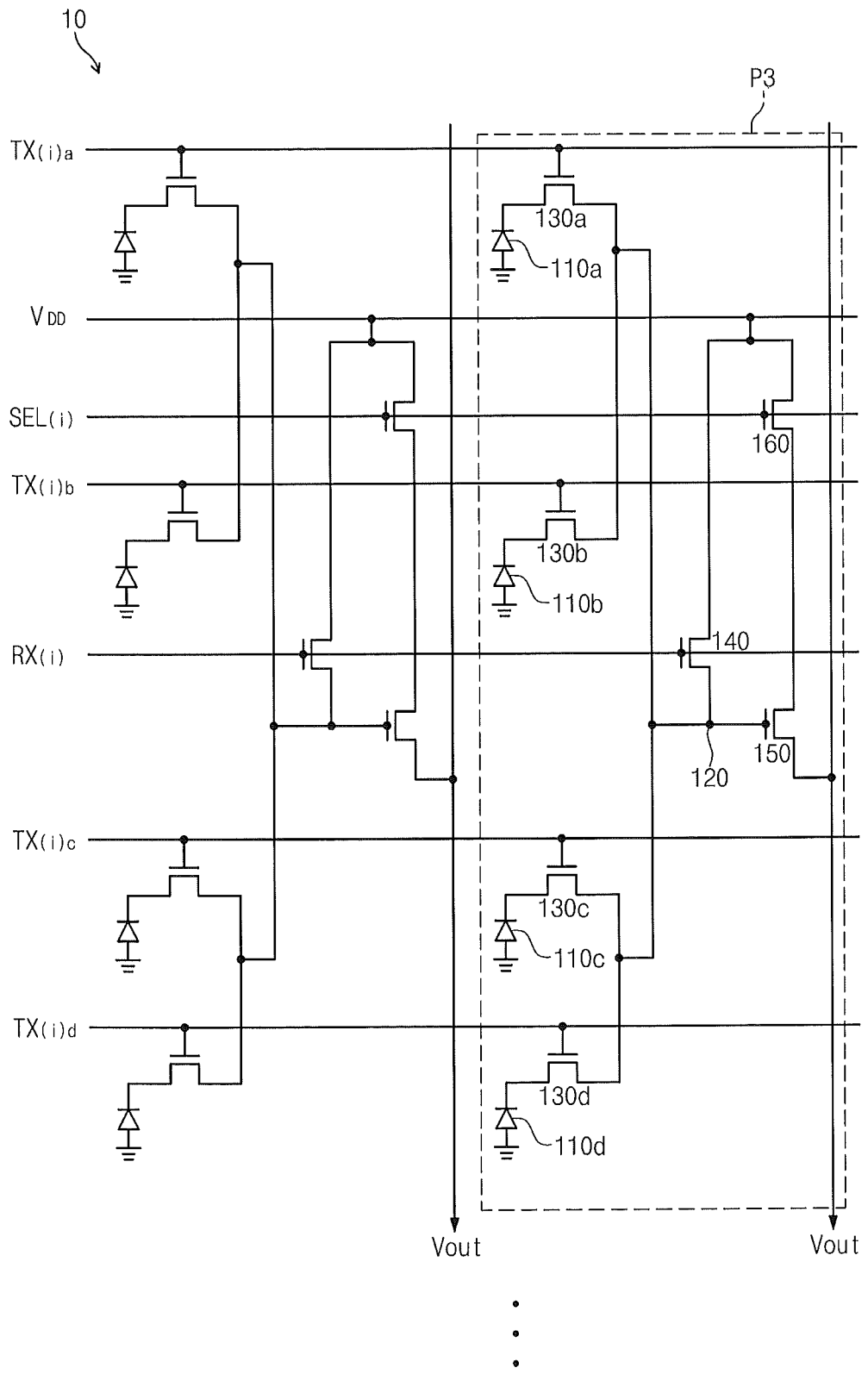

FIGS. 2A to 2C are equivalent circuit diagrams illustrating active pixel sensor (APS) arrays of CMOS image sensors according to some embodiments.

The active pixel sensor (APS) arrays 10 may include a plurality of unit pixels P1, and the plurality of unit pixels P1 may be arrayed in a matrix form. Each of the unit pixels P1 may include a photoelectric conversion device 110 that receives light to generate and store electric charges, and may further include one or more reading devices that read an optical signal generated in the photoelectric conversion device 110. The reading devices may include a reset element 140, an amplification element 150, and a selection element 160.

FIG. 2A illustrates a plurality of unit pixels, and each of the unit pixels includes four N-channel MOS transistors. Referring to FIG. 2A, each unit pixel P1 may be composed of a single photoelectric conversion device 110 and four MOS transistors 130, 140, 150 and 160. Alternatively, the unit pixel P1 may be composed of a different number of MOS transistors (e.g., three MOS transistors or five MOS transistors).

More specifically, the photoelectric conversion device 110 generates and stores charges corresponding to incident light. The photoelectric conversion device 110 may include at least one of a photo diode, a photo transistor, a photo gate, and a pinned photo diode (PPD). The photoelectric conversion device 110 illustrated in FIG. 2A is be a pinned photo diode (PPD). The photoelectric conversion device 110 may be connected to a charge transmission element 130 that transmits stored charges to a detection device 120.

A floating diffusion (FD) region doped with N-type impurities may be used as the detection device 120. The floating diffusion (FD) region may receive the charges stored in the photoelectric conversion device 110 to accumulate charges therein. The detection device 120 (e.g., the floating diffusion (FD) region) may be electrically connected to the amplification element 150 to control the amplification element 150.

The charge transmission element 130 may transmit the charges stored in the photoelectric conversion device 110 to the detection device 120. The charge transmission element 130 may generally be composed of one MOS transistor and may be controlled by a bias applied to a charge transmission signal line TX(i).

The reset element 140 may periodically reset the detection device 120 and may be composed of one MOS transistor. A source of the reset element 140 may be connected to the detection device 120 and a drain of the reset element 140 may be connected to a power supply terminal that has a power supply voltage $V_{DD}$. The reset element 140 may be driven by a bias applied to a reset signal line RX(i). When the reset element 140 is turned on by the bias applied to the reset signal line RX(i), the power supply voltage $V_{DD}$ may be applied to the detection device 120. Therefore, the detection device 120 may be reset when the reset element 140 is turned on.

The amplification element 150 may, together with a constant current source located outside the unit pixel P1, serve as a source follower buffer amplifier. The amplification element 150 may amplify a variation of the electric potential at the detection device 120 and may output the amplified variation of the electric potential to an output line Vout through the selection element 160.

The selection elements 160 may select the unit pixels P1 in a single row and may be composed of one MOS transistor. The selection elements 160 in the single row may be driven by a bias applied to a row select signal line SEL(i). When the selection elements 160 are turned on by the bias applied to the row select signal line SEL(i), the output signals of the amplification elements 150 (e.g., composed of MOS transistors) may be transmitted to the output lines $V_{out}$.

The driving signal lines TX(i), RX(i), and SEL(i) may be electrically connected to the charge transmission elements 130, the reset elements 140, and the select elements 160, respectively. The driving signal lines TX(i), RX(i), and SEL (i) may extend in a row direction (e.g., a horizontal direction) so as to simultaneously drive multiple unit pixels P1 arrayed in the same row.

FIG. 2B illustrates an active pixel sensor array of an image sensor according to some embodiments. As illustrated in FIG. 2B, the active pixel sensor array 10 may include a plurality of two-shared pixels P2 that are arrayed in a matrix than. In each of the two-shared pixels P2, two photoelectric conversion devices 110a and 110b may share a single reading device (e.g., a single set of reading device elements) that includes a reset element 140, an amplification element 150, and/or a selection element 160. That is, the pair of photoelectric conversion devices 110a and 110b may share the reset element 140, the amplification element 150, and/or the selection element 160. The pair of photoelectric conversion devices 110a and 110b may be electrically connected to a pair of charge transmission elements 130a and 130b. For example, each of the photoelectric conversion devices 110a and 110b may be connected to a respective one of the charge transmission elements 130a and 130b. The charge transmission elements 130a and 130b may transmit charges in the photoelectric conversion devices 110a and 110b to the reading device.

According to some embodiments of the APS array 10 illustrated in FIG. 2B, a bias applied to the row select signal line SEL(i) may turn on the plurality of selection elements 160 in a single row to select the two-shared pixels P2 in the single row. Further, in each of the two-shared pixels P2, biases applied to the pair of charge transmission signal lines TX(i)a and TX(i)b may turn on one of the pair of charge transmission elements 130a and 130b to select one of the pair of photoelectric conversion elements 110a or 110b of the two-shared pixels P2. Thus, charges in the selected photoelectric conversion element 110a or 110b may be transmitted to the detection device 120 connected to the selected photoelectric conversion element 110a or 110b.

FIG. 2C illustrates an active pixel sensor array of an image sensor according to some embodiments. As illustrated in FIG. 2C, the active pixel sensor array 10 may include a plurality of four-shared pixels P3 that are arrayed in a matrix form. In each of the four-shared pixels P3, four photoelectric conversion devices 110a, 110b, 110c, and 110d may share a single reading device that includes a reset element 140, an amplification element 150 and/or a selection element 160. That is, the four photoelectric conversion devices 110a, 110b, 110c, and 110d may share the reset element 140, the amplification element 150, and/or the selection element 160. The four photoelectric conversion devices 110a, 110b, 110c, and 110d may be electrically connected to four charge transmission elements 130a, 130b, 130c and 130d, respectively. The charge transmission elements 130a, 130b, 130c and 130d may transmit charges in the photoelectric conversion devices 110a, 110b, 110c and 110d to the reading device.

Accordingly, in each of the four-shared pixels P3, a combination of biases applied to the charge transmission signal lines TX(i)a, TX(i)b, TX(i)c, and TX(i)d may turn on one of the four charge transmission elements 130a, 130b, 130c, and 130d to select one of the four photoelectric conversion elements 110a, 110b, 110c, and 110d of the four-shared pixels P3. Thus, charges in the selected photoelectric conversion element 110a 110b, 110c, or 110d may be transmitted to the detection device 120 connected to the selected photoelectric conversion element 110a, 110b, 110c, or 110d.

Figure 3:
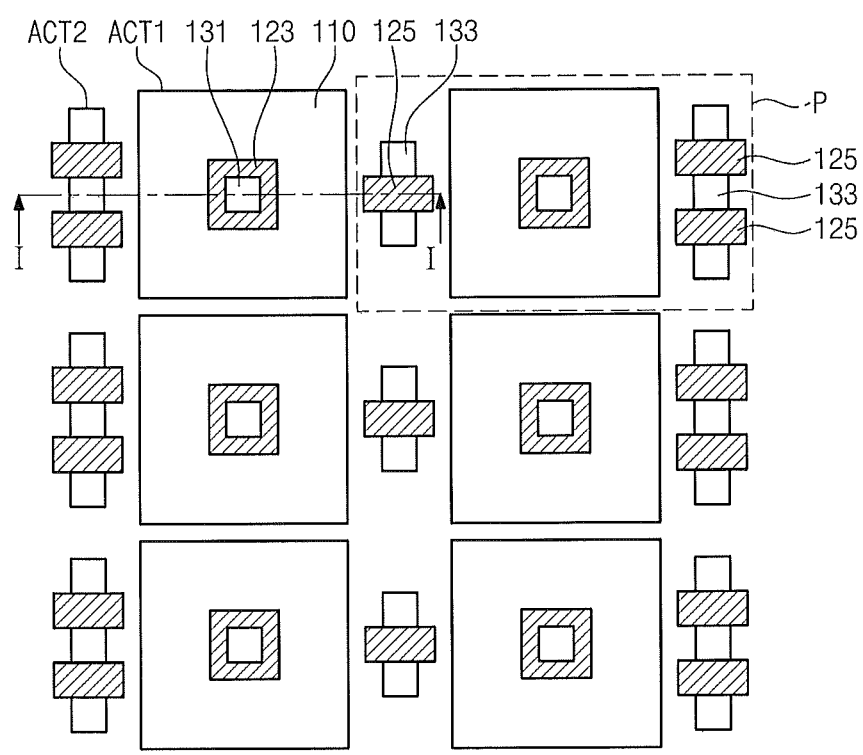
FIG. 3 is a schematic plan view illustrating an image sensor according to some embodiments.
Figure 4:
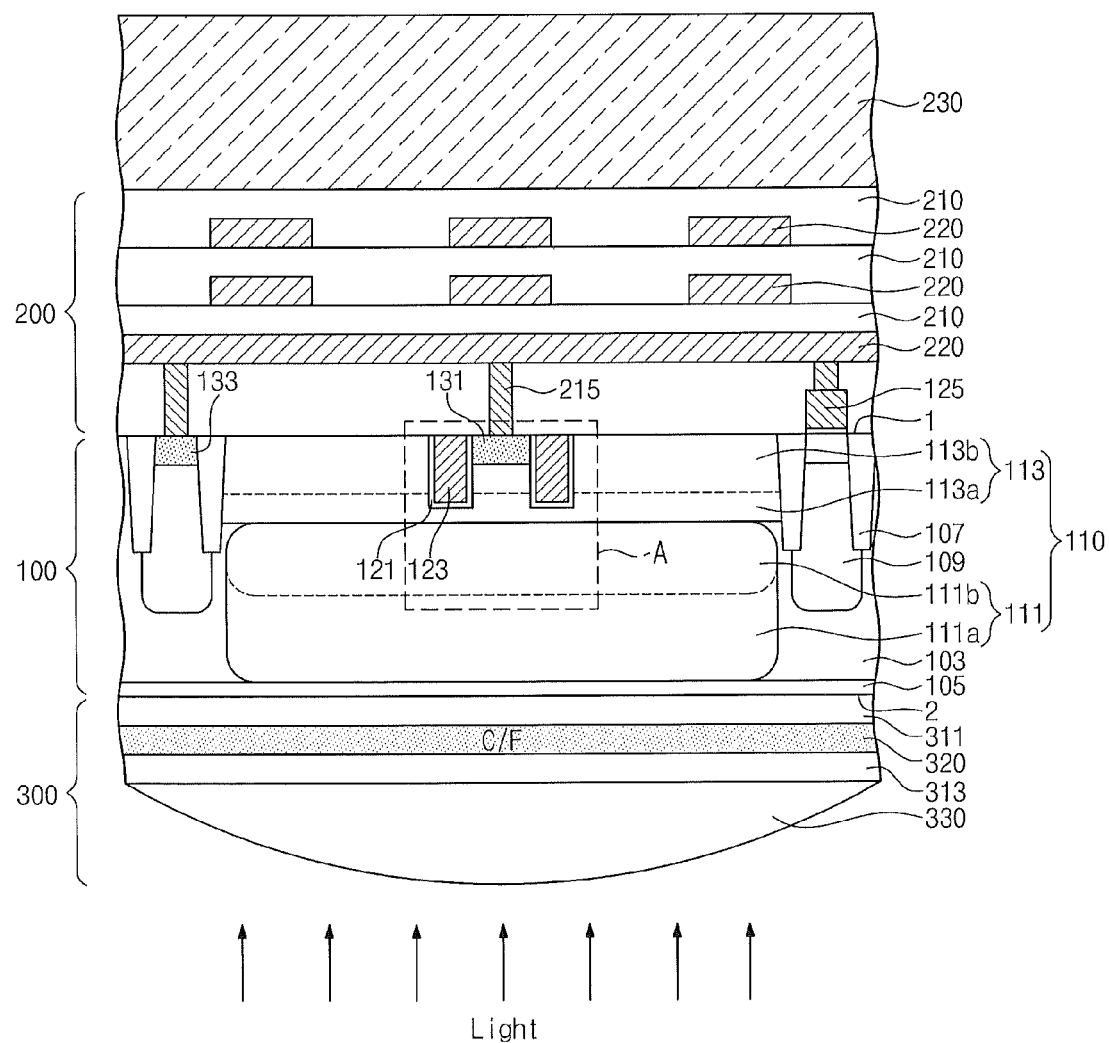
FIG. 4 is a cross-sectional view taken along line I-I' of FIG. 3 to illustrate an image sensor according to some embodiments.
Figure 5:
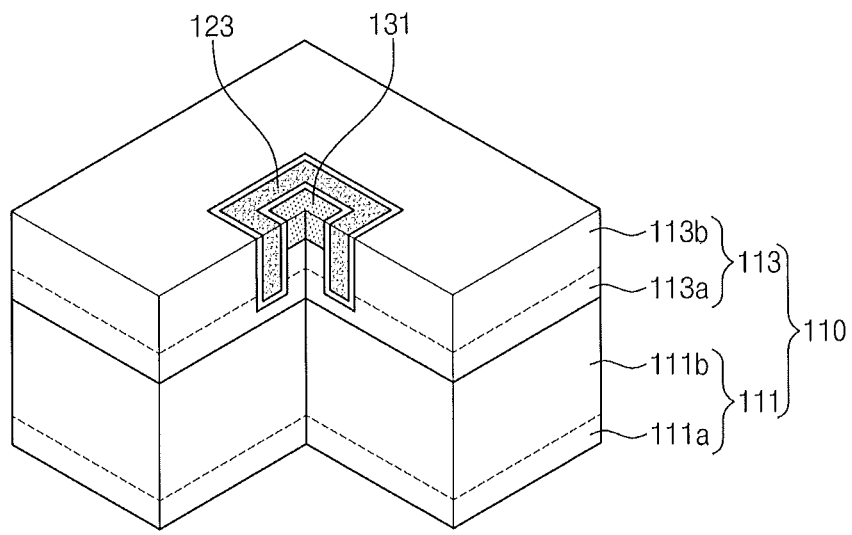
FIG. 5 is a cut-away perspective view illustrating a photoelectric conversion device, a transfer gate, and a floating diffusion region of an image sensor according to some embodiments.
Figure 6A:
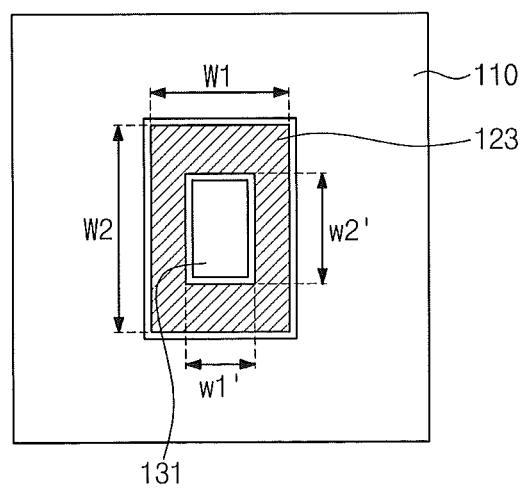
FIGS. 6A to 6E illustrate a transfer gate of an image sensor according to some embodiments.
Figure 6B:
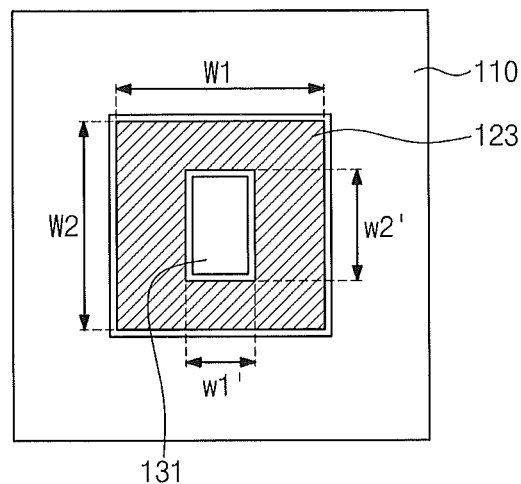
Figure 6C:
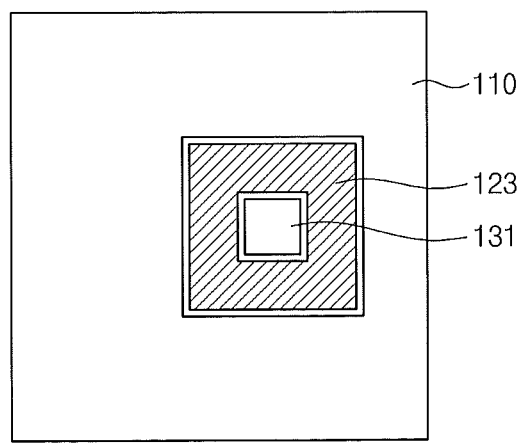
Figure 6D:
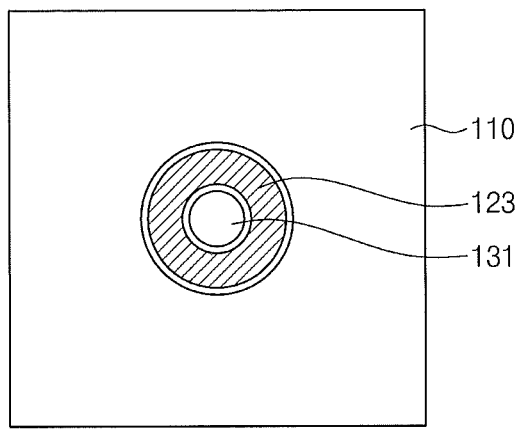
Figure 6E:
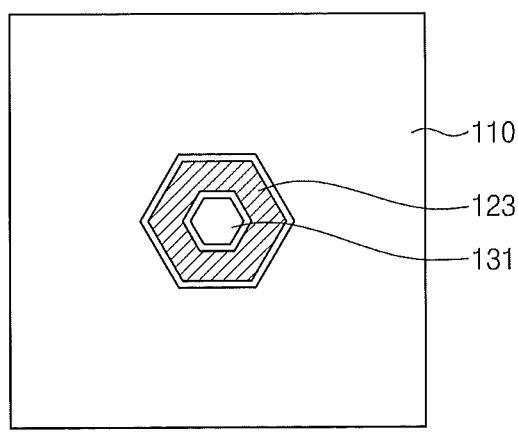

FIG. 3 is a schematic plan view illustrating an image sensor according to some embodiments, and FIG. 4 is a cross-sectional view taken along line I-I' of FIG. 3 according to some embodiments. FIG. 5 is a cut-away perspective view illustrating a photoelectric conversion device, a transfer gate, and a floating diffusion region of an image sensor according to some embodiments, and FIGS. 6A to 6E illustrate a transfer gate of an image sensor according to some embodiments. In addition, FIGS. 7A to 7D are enlarged views of a portion 'A' of FIG. 4 to illustrate an image sensor according to some embodiments.

Referring to FIGS. 3 and 4, an image sensor according to some embodiments may include a semiconductor layer 100 having a first surface (e.g., a front side surface) 1 and a second surface (e.g., a back side surface) 2 that are opposite each other. Further, the image sensor may include an interconnection layer 200 disposed on the first surface 1 of the semiconductor layer 100 and a light transmission layer 300 disposed on the second surface 2 of the semiconductor layer 100.

The semiconductor layer 100 may be a substrate including a bulk silicon substrate of a first conductivity type (for example, P-type) and an epitaxial layer 103 of the first conductivity type on the bulk silicon substrate. Alternatively, the semiconductor layer 100 may include only the P-type epitaxial layer 103 without the bulk silicon substrate. Additionally, the semiconductor layer 100 may be a bulk semiconductor substrate having a well of the first conductivity type. Moreover, the semiconductor layer 100 may include an N-type epitaxial layer, a bulk silicon substrate, a silicon-on-insulator (SOI) substrate, or the like.

In some embodiments, an external light (e.g., an incident light) may be irradiated onto the semiconductor layer 100, and a penetration depth of the incident light into the semiconductor layer 100 may be varied according to a wavelength of the incident light. Thus, a thickness of the semiconductor layer 100 may be determined according to the wavelength of the incident light irradiated to the photoelectric conversion devices 110. For example, the semiconductor layer 100 may have a thickness within the range of about 1 μm to 5 μm. The incident light may be irradiated onto the second surface 2 of the semiconductor layer 100, as illustrated in FIG. 4.

An isolation layer 107 for defining active regions may be disposed in the semiconductor layer 100. As illustrated in FIG. 3, the active regions defined by the isolation layer 107 may include first active regions ACT1 for the photoelectric conversion devices 110 and second active regions ACT2 for the reading devices (e.g., the reset elements 140, the amplification elements 150, and the selection elements 160 of FIG. 2A). In some embodiments, the first active regions ACT1 may be disposed between the second active regions ACT2 (e.g., between a pair of the second active regions ACT2), as illustrated in FIG. 3. However, the shape and array form of the active regions ACT1 and ACT2 are not limited to those illustrated in FIG. 3, but rather the shape and array form of the active regions ACT1 and ACT2 may be embodied in many different forms.

Referring still to FIGS. 3 and 4, the photoelectric conversion devices 110 may be disposed in the semiconductor layer 100 and may be arrayed in a matrix form on a same plane. The photoelectric conversion devices 110 may generate and store charges therein when the incident light is irradiated to the photoelectric conversion devices 110. The amount of the charges generated in the photoelectric conversion devices 110 may be proportional to the intensity of the incident light. In some embodiments, each of the photoelectric conversion devices 110 may have substantially a rectangular shape in a plan view. Further, each of the photoelectric conversion devices 110 may include a pinned photodiode having a PNP junction structure. That is, the pinned photodiode may include a P-type epitaxial layer 103, an N-type impurity layer 111 and a P-type impurity layer 113 that are vertically stacked. A potential level of the pinned photodiode may be pinned to have a specific value when the pinned photodiode is sufficiently depleted. Each of the photoelectric conversion devices 110 may include a photodiode, a phototransistor, or a photo gate instead of the pinned photodiode.

Specifically, the incident light irradiated to the semiconductor layer 100 may generate and store charges in the N-type impurity layer 111 constituting the photoelectric conversion device 110. In some embodiments, the N-type impurity layer 111 may include a first impurity region 111a and a second impurity region 111b, as illustrated in FIG. 4. In more detail, the first impurity region 111a may be disposed at a deeper position from the first surface 1 of the semiconductor layer 100 than the second impurity region 111b. Moreover, in the N-type impurity layer 111, an N-type impurity concentration of the second impurity region 111b may be higher than that of the first impurity region 111a. For example, the first impurity region 111a may have an N-type impurity concentration of about $1\times10^{14}$ atoms/cm$^3$ to about $1\times10^{17}$ atoms/cm$^3$, and the second impurity region 111b may have an N-type impurity concentration of about $1\times10^{17}$ atoms/cm$^3$ to about $1\times10^{20}$ atoms/cm$^3$. However, the impurity concentration and the depth of the first and second impurity regions 111a and 111b may vary according to the fabrication process and the design of the image sensor. Thus, the impurity concentration and the depth of the first and second impurity regions 111a and 111b are not limited to the above examples.

The N-type impurity layer 111 may be spaced apart from the first surface 1 of the semiconductor layer 100 and may be buried in the semiconductor layer 100. The number of surface defects in the semiconductor layer 100 may be reduced as a distance from the first surface 1 is increased. Thus, if the distance between the first surface 1 and the N-type impurity layer 111 as well as the space between the adjacent N-type impurity layers 111 increase, a dark current and a white spot phenomenon due to the surface defects may be reduced and/or suppressed.

In some embodiments, the P-type impurity layer 113 of the photoelectric conversion device 110 may include a surface impurity region 113b acting as a hole accumulation region and an electric potential barrier region 113a acting as a charge transfer barrier region. The P-type impurity layer 113 may include a channel region to be formed according to a bias applied to a transfer gate electrode 123.

In more detail, the surface impurity region 113b adjacent the first surface 1 may reduce surface defects (for example, dangling bonds) existing near the first surface 1 or thermally-generated electron-hole pairs, thereby suppressing the dark current. That is, holes of the electron-hole pairs generated near the first surface 1 may drift into the semiconductor layer 100, which is grounded, and electrons of the electron-hole pairs generated near the first surface 1 may recombine with the holes (corresponding to the majority carrier) in the surface impurity region 113b to disappear. For example, the surface impurity region 113b may have a P-type impurity concentration (e.g., a hole concentration) within the range of about $1\times10^{17}$ atoms/cm$^3$ to about $1\times10^{20}$ atoms/cm$^3$. The impurity concentration of the surface impurity region 113b may vary according to the fabrication process and/or the design of the image sensor. Thus, the impurity concentration of the surface impurity region 113b is not limited to the above examples. Further, a depth of the surface impurity region 113b from the first surface 1 of the semiconductor layer 100 may vary according to process conditions. For example, in some embodiments, the surface impurity region 113b may be shallower from the first surface 1 of the semiconductor layer 100 than the floating diffusion region 131. The electric potential barrier region 113a may be disposed between the surface impurity region 113b and the N-type impurity layer 111, thereby acting as a potential barrier between the N-type impurity layer 111 and the floating diffusion region 131. The electric potential of the electric potential barrier region 113a may be controlled by a voltage applied to the transfer gate electrode 123 constituting the charge transmission element 130, 130a, or 130b of FIG. 2A or FIG. 2B. The P-type impurity concentration of the electric potential barrier region 113a may be lower than that of the surface impurity region 113b. For example, the electric potential barrier region 113a may have a P-type impurity concentration within the range of about $1\times10^{14}$ atoms/cm$^3$ to about $1\times10^{17}$ atoms/cm$^3$.

In some embodiments, the N-type impurity layer 111, the P-type impurity layer 113, and the floating diffusion region 131 may be referred to as a lower impurity region, a channel region, and an upper impurity region, respectively. Alternatively, the N-type impurity layer 111, the P-type impurity layer 113, and the floating diffusion region 131 may be referred to as a charge storage layer, a channel layer, and a charge detecting layer, respectively. In addition, a region including the N-type impurity layer 111, the P-type impurity layer 113, and the floating diffusion region 131 may be referred to as a light receiving region.

Referring again to FIGS. 3 and 4, the charge transmission element, that is, the transfer gate electrode 123 may overlap with the photoelectric conversion device 110 when viewed from a plan view. In some embodiments, the transfer gate electrode 123 may be disposed on a center portion of the photoelectric conversion device 110. Because the transfer gate electrode 123 is vertically disposed on the photoelectric conversion device 110, an area that the transfer gate electrode 123 occupies may be reduced/minimized.

According to some embodiments, the transfer gate electrode 123 is disposed on the central portion of the photoelectric conversion device 110, as described above. Thus, distances from the transfer gate electrode 123 to all edges of the photoelectric conversion device 110 may be substantially equal. Therefore, when the charges generated from the photoelectric conversion device 110 are transferred into the detection device (e.g., the floating diffusion region 131), the electric field formed by a bias applied to the transfer gate electrode 123 may be uniformly distributed throughout the photoelectric conversion device 110. As a result, all of the charges stored in the N-type impurity region 111 may be easily and completely transferred into the floating diffusion region 131.

In some embodiments, the position on the central portion of the N-type impurity layer 111 may correspond to a region having a highest electric potential in the photoelectric conversion device 110. That is, the transfer gate electrode 123 is disposed at a region having the highest electric potential in the photoelectric conversion device 110, as illustrated in FIG. 4. Alternatively, the transfer gate electrode 123 may be disposed on an edge of the photoelectric conversion device 110 when viewed from a plan view. In such a case, a distance between the highest electric potential region and the transfer gate electrode 123 may increase to reduce the electric field applied to the photoelectric conversion device 110 when a certain voltage is applied to the transfer gate electrode 123. However, according to some embodiments, the distance between the highest electric potential region in the photoelectric conversion device 110 and the transfer gate electrode 123 may decrease to increase/maximize the influence of the electric field formed by a certain voltage applied to the transfer gate electrode 123 on the photoelectric conversion device 110. This is because the transfer gate electrode 123 is disposed at the highest electric potential region in the photoelectric conversion device 110, as described above. That is, the efficiency with which charges in the photoelectric conversion device 110 are transmitted into the floating diffusion region 131 may be increased/improved. As a result, the charge transmission efficiency of the image sensor may be enhanced.

The transfer gate electrode 123 may have a closed loop shape (for example, a ring shape, a tube shape, or a polygonal shape) when viewed from a plan view. That is, the transfer gate electrode 123 may have an opening that penetrates a central portion thereof, and the opening of the transfer gate electrode 123 may expose a portion of the photoelectric conversion device 110. In some embodiments, the transfer gate electrode 123 may have a rectangular shape with an opening at a central portion thereof when viewed from a plan view. In some embodiments, the transfer gate electrode 123 may include a square shape having a horizontal width and a vertical width that are equal to each other when viewed from a plan view. In such a case, a horizontal width of the opening may also be substantially equal to a vertical width of the opening. Alternatively, as illustrated in the plan view of FIG. 6A, the horizontal width W1 of the transfer gate electrode 123 may be different from (e.g., smaller than) the vertical width W2 of the transfer gate electrode 123, and the horizontal width W1' of the opening of the transfer gate electrode 123 may also be different from the vertical width W2' of the opening of the transfer gate electrode 123. Alternatively, in some embodiments, as illustrated in the plan view of FIG. 6B, the horizontal width W1 of the transfer gate electrode 123 may be substantially equal to the vertical width W2 of the transfer gate electrode 123, and the horizontal width W1' of the opening of the transfer gate electrode 123 may be different from the vertical width W2' of the opening of the transfer gate electrode 123. Additionally, in some embodiments, a planar structure of the transfer gate electrode 123 may have a rectangular closed loop shape, as illustrated in the plan view of FIG. 3. Alternatively, in some embodiments, a planar structure of the transfer gate electrode 123 may have a circular shape, a hexagonal shape, or an octagonal shape, as illustrated in the plan view of FIG. 6D or 6E. In the event that the transfer gate electrode 123 is designed to have a closed loop shape as described above, a gate width of the transfer gate electrode 123 may increase. Thus, during operation of the image sensor, the influence of the electric field formed by a bias voltage applied to the transfer gate electrode 123 on the photoelectric conversion device 110 may significantly increase. That is, the efficiency with which charges in the photoelectric conversion device 110 are transmitted into the floating diffusion region 131 may improve. As a result, the charge transmission efficiency of the image sensor may be enhanced.

Furthermore, according to some embodiments, the transfer gate electrode 123 may be disposed inside the semiconductor layer 100. That is, the transfer gate electrode 123 may be buried in the semiconductor layer 100. Alternatively, if the transfer gate electrode 123 is disposed on a surface of the semiconductor layer 100, a distance between the N-type impurity layer 111 and the transfer gate electrode 123 may increase due to the presence of the P-type impurity layer 113 between the N-type impurity layer 111 and the transfer gate electrode 123. In such a case, the charge transmission efficiency of the image sensor may be degraded. However, according to some embodiments herein, the transfer gate electrode 123 having a closed loop shape may be disposed inside the semiconductor layer 100, as illustrated in FIG. 4. Thus, the distance between the N-type impurity layer 111 and the transfer gate electrode 123 may decrease to enhance the charge transmission efficiency of the image sensor.

Referring again to FIG. 4, the transfer gate electrode 123 having a closed loop shape in a plan view may extend from the first surface 1 of the semiconductor layer 100 toward the second surface 2 opposite the first surface 1.

Figure 7A:
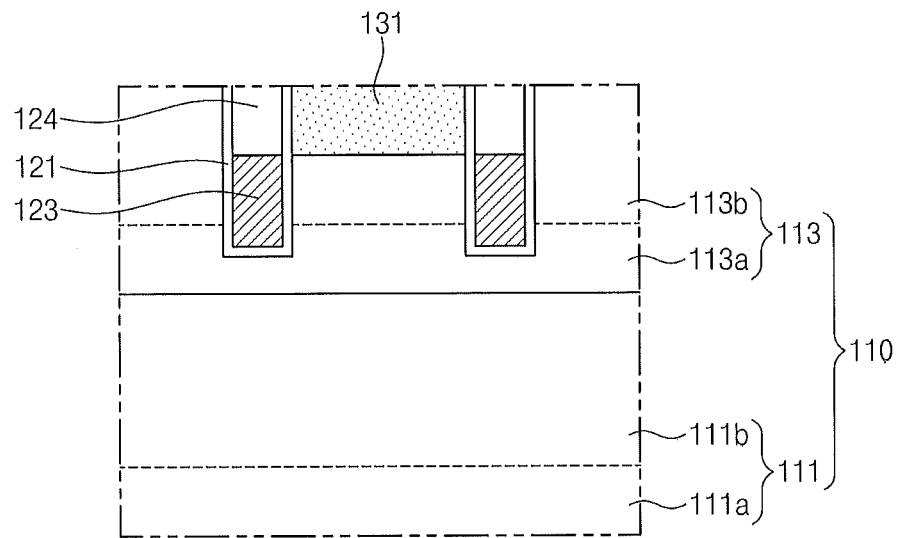
FIGS. 7A to 7D are enlarged views of a portion 'A' of FIG. 4 that illustrate an image sensor according to some embodiments.
Figure 7B:
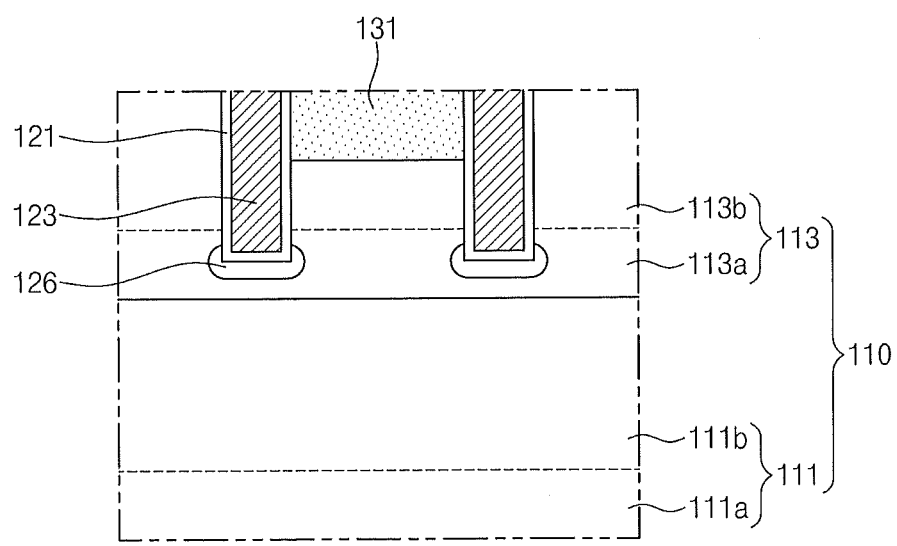

Referring to FIGS. 7A and 7B, the transfer gate electrode 123 having a closed loop shape may be inserted into the P-type impurity layer 113 adjacent the first surface 1 of the semiconductor layer 100. Thus, the transfer gate electrode 123 may surround (e.g., may border a plurality of sides of) a portion of the P-type impurity layer 113. Therefore, the P-type impurity layer 113 may include an inner region surrounded by the transfer gate electrode 123 and an outer region disposed adjacent an outer sidewall of the transfer gate electrode 123. The inner region and the outer region of the P-type impurity layer 113 may laterally extend to be in contact with each other at a region under the transfer gate electrode 123.

Because the transfer gate electrode 123 is disposed inside the P-type impurity layer 113, a bottom surface of the transfer gate electrode 123 may be closer to the first surface 1 of the semiconductor layer 100 than a distance between the first surface 1 of the semiconductor layer 100 and a topmost surface of the N-type impurity layer 111. That is, the bottom surface of the transfer gate electrode 123 may be spaced apart from the topmost surface of the N-type impurity layer 111. Further, the bottom surface of the transfer gate electrode 123 may be located at a level between the top surface of the N-type impurity layer 111 and a bottom surface of the floating diffusion region 131. In addition, the bottom surface of the transfer gate electrode 123 may be located in the electric potential barrier region 113a which is doped with P-type impurities. An interface surface between the N-type impurity layer 111 and the P-type impurity layer 113 may be substantially flat.

A gate insulating layer 121 may be disposed between the transfer gate electrode 123 and the semiconductor layer 100 including the photoelectric conversion device 110. The gate insulating layer 121 may be conformably formed on a surface of the transfer gate electrode 123 having a hollow cylinder shape.

Referring to FIGS. 7A to 7D, a top surface of the transfer gate electrode 123 may be coplanar with or lower than the first surface 1 of the semiconductor layer 100. Specifically, the transfer gate electrode 123 may be completely buried in the semiconductor layer 100 by a capping insulating layer 124 disposed on the transfer gate electrode 123, as illustrated in FIG. 7A. Alternatively, the transfer gate electrode 123 may extend vertically to upwardly protrude from the first surface 1 of the semiconductor layer 100.

Figure 7C:
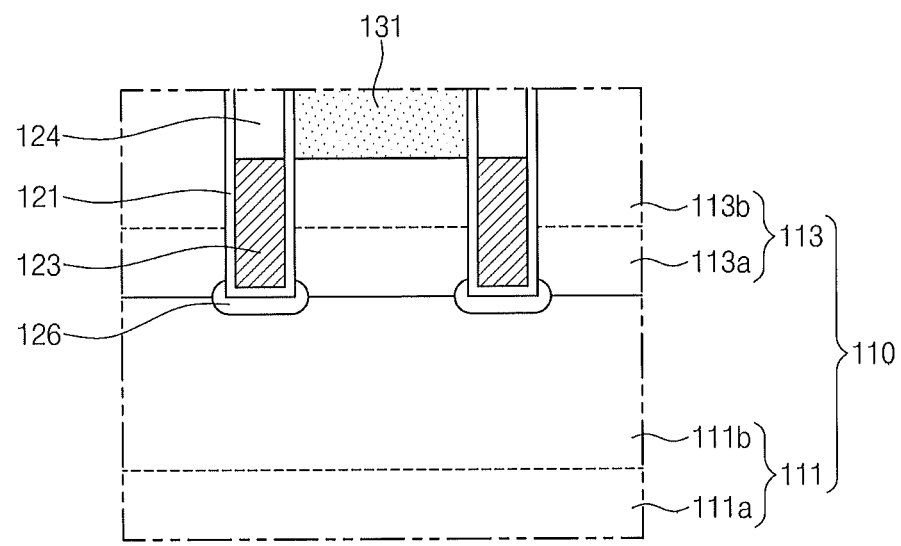

Referring to FIGS. 7B and 7C, a local impurity region 126 having the same conductivity type as the P-type impurity layer 113 may be disposed under the transfer gate electrode 123. A P-type impurity concentration of the local impurity region 126 may be higher than that of the electric potential barrier region 113a. For example, the local impurity region 126 may have a P-type impurity concentration within the range of about $1 \times 10^{17}$ atoms/cm$^3$ to about $1 \times 10^{20}$ atoms/cm$^3$. Thus, when the charges in the N-type impurity layer 111 are transmitted into the floating diffusion region 131, the electric potential at the local impurity region 126 may be higher than the electric potential at the region (e.g., the inner region of the P-type impurity layer 113) surrounded by the transfer gate electrode 123. That is, the local impurity region 126 may provide a potential gradient so that the charges in the N-type impurity layer 111 are easily drifted into the semiconductor layer 100 disposed in the hollow region surrounded by the transfer gate electrode 123.

Referring to FIG. 7C, the bottom surface of the transfer gate electrode 123 may be located at an interface between the P-type impurity layer 113 and the N-type impurity layer 111.

Figure 7D:
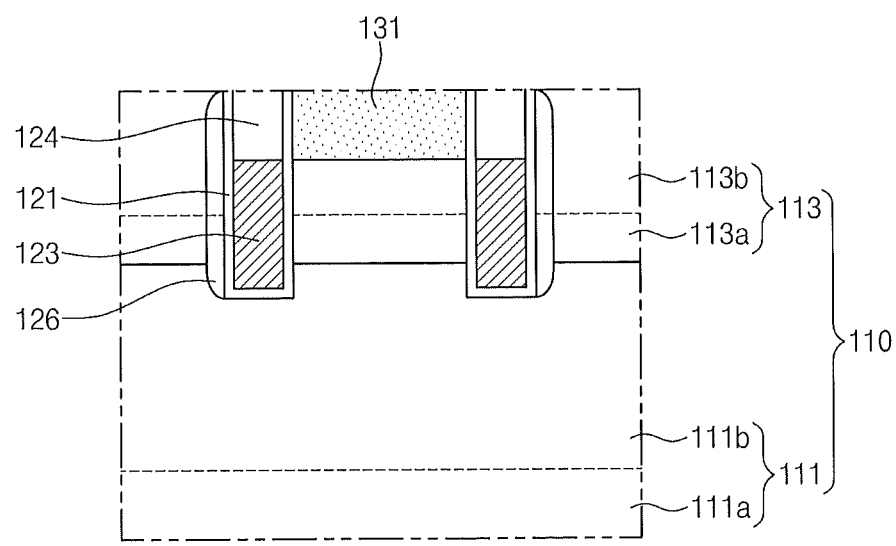

Alternatively, the transfer gate electrode 123 may extend into the N-type impurity layer 111 of the photoelectric conversion device 110, as illustrated in FIG. 7D. That is, the bottom surface of the transfer gate electrode 123 may be located inside the N-type impurity layer 111.

Referring still to FIG. 7D, the local P-type impurity region 126 may be disposed to be adjacent the outer sidewall of the transfer gate electrode 123, and the local P-type impurity region 126 may have an impurity concentration higher than that of the P-type impurity layer 113. Because the impurity concentration of the local P-type impurity region 126 is higher than that of the P-type impurity layer 113, the local P-type impurity region 126 may act as a potential barrier when the charges in the N-type impurity layer 111 are transmitted into the floating diffusion region 131. As a result, the charges in the N-type impurity layer 111 are easily drifted into the semiconductor layer 100 disposed in the hollow region surrounded by the transfer gate electrode 123.

Referring again to FIGS. 3 and 4, the detecting device (e.g., the floating diffusion region 131) may be formed in the P-type impurity layer 113 exposed by the opening of the transfer gate electrode 123 having the closed loop shape. In other words, the floating diffusion region 131 may be surrounded by the transfer gate electrode 123 having the closed loop shape. The floating diffusion region 131 may correspond to a region which is doped with N-type impurities having an opposite conductivity type to the P-type impurity layer 113. The floating diffusion region 131 may be vertically self-aligned with the opening of the transfer gate electrode 123 having the closed loop shape.

In more detail, the floating diffusion region 131 may be formed in the P-type impurity layer 113 of the photoelectric conversion device 110 and may be vertically spaced apart from the N-type impurity layer 111. The floating diffusion region 131 may overlap with the photoelectric conversion device 110 and may be disposed at the central region of the photoelectric conversion device 110 when viewed from a plan view. Moreover, a sidewall of the floating diffusion region 131 may be completely surrounded by the buried transfer gate electrode 123 having the closed loop shape, which is disposed in the P-type impurity layer 113. That is, the floating diffusion region 131 may be isolated by the transfer gate electrode 123 in the semiconductor layer 100 because the floating diffusion region 131 may be surrounded by the transfer gate electrode 123 having the closed loop shape.

The floating diffusion region 131 may be self-aligned with the hollow region surrounded by the transfer gate electrode 123. Thus, the sidewall of the floating diffusion region 131 may be in contact with the transfer gate electrode 123, and the bottom surface of the floating diffusion region 131 may be in contact with the P-type impurity layer 113. That is, a junction area between the floating diffusion region 131 and the P-type impurity layer 113 of the embodiment of FIG. 4 may be less than a junction area between the floating diffusion region 131 and the P-type impurity layer 113 when the floating diffusion region 131 is directly surrounded by the P-type impurity layer 113 without the buried transfer gate electrode 123. Accordingly, a junction leakage current between the floating diffusion region 131 and the P-type impurity layer 113 may be significantly reduced.

As described above, the image sensor according to some embodiments may include the N-type impurity layer 111, the P-type impurity layer 113, and the floating diffusion region 131, which are sequentially and vertically stacked in the semiconductor layer 100. The floating diffusion region 131 may be locally disposed in the P-type impurity layer 113, and the transfer gate electrode 123 having the closed loop shape may completely surround the sidewall of the floating diffusion region 131. Thus, during operation of the image sensor, the transfer gate electrode 123 having the closed loop may control the electric potential of the P-type impurity layer 113 vertically positioned between the N-type impurity layer 111 and the floating diffusion region 131. As a result, charges stored in the N-type impurity layer 111 may be transmitted into the floating diffusion region 131 through the P-type impurity layer 113 surrounded/bordered by the transfer gate electrode 123. That is, the P-type impurity layer 113 surrounded/bordered by the transfer gate electrode 123 may act as a channel region.

The transfer gate electrode 123 and the floating diffusion region 131 may overlap the photoelectric conversion device 110 when viewed from a plan view, as illustrated in FIGS. 3 and 4. Accordingly, an area that the transfer gate electrode 123 and the floating diffusion region 131 separately occupy in the semiconductor layer 100 may be reduced, whereas an area of the photoelectric conversion device 110 may be increased in a limited area. This may provide an increased fill factor of the image sensor. The fill factor relates to an area that the photoelectric conversion device 110 occupies in a unit pixel.

Referring still to FIGS. 3 and 4, a P-type isolation well 109 may be disposed between a pair of adjacent photoelectric conversion devices 110. A bottom surface of the P-type isolation well 109 may be located at a level between the bottom surface of the isolation layer 107 and the second surface 2 of the semiconductor layer 100. A depth of the P-type isolation well 109 may be equal to or greater than that of the photoelectric conversion devices 110 in order to reduce/prevent the cross talk between the unit pixels. For example, the depth of the P-type isolation well 109 may be substantially equal to a thickness of the semiconductor layer 100. Alternatively, formation of the P-type isolation well 109 may be omitted, and a vertical thickness of the isolation layer 107 may increase to reduce/suppress cross talk between the adjacent pixels.

As illustrated in FIG. 4, the semiconductor layer 100 may include a heavily doped impurity layer 105 that is shallowly formed along the second surface 2. The heavily doped impurity layer 105 may be doped with P-type impurities such as boron ions. The P-type heavily doped impurity layer 105 may have an impurity concentration higher than an impurity concentration of the P-type epitaxial layer 103. If the P-type heavily doped impurity layer 105 is absent, the semiconductor layer 100 near the second surface 2 may have a low impurity concentration. Thus, the semiconductor layer 100 near the second surface 2 may have a low electric potential due to dangling bonds, surface defects and/or interface traps generated by etching stress applied to the second surface 2. As a result, a depletion well may be formed in the semiconductor layer 100 near the second surface 2. However, according to some embodiments herein, the P-type heavily doped impurity layer 105 may be disposed in the semiconductor layer 100 near the second surface 2, and an impurity concentration of the P-type heavily doped impurity layer 105 may be higher than that of the P-type epitaxial layer 103. Thus, the P-type heavily doped impurity layer 105 may reduce/prevent formation of the depletion well in the semiconductor layer 100 near the second surface 2. Further, the P-type heavily doped impurity layer 105 may act as an electric potential barrier that reduces/prevents drift of charges generated in the semiconductor layer 100 near the second surface 2 into the photoelectric conversion device 110. During operation of the image sensor, holes of the electron-hole pairs generated near the second surface 2 may be drifted and/or diffused into the semiconductor layer 100 grounded through the P-type heavily doped impurity layer 105, and electrons of the electron-hole pairs generated near the first surface 2 may recombine with the holes (corresponding to the majority carrier) in the P-type heavily doped impurity layer 105 to disappear.

Referring again to FIGS. 3 and 4, the interconnection layer 200 may be disposed on the first surface 1 of the semiconductor layer 100, as described above. The interconnection layer 200 may include the photoelectric conversion device 110, the charge transmission element 130, and the detecting device 120. The interconnection layer 200 may read electrical signals generated by the photoelectric conversion device 110 and may include control devices that control the unit pixels. Specifically, the interconnection layer 200 may include the row decoder 20, the row driver 30, the column decoder 40, the timing generator 50, the correlated double sampler 60, the analog to digital converter 70, and the input/output (I/O) buffer 80 illustrated in FIG. 1.

In more detail, the interconnection layer 200 may include gate electrodes of MOS transistors controlling the unit pixels. In some embodiments, the reading devices (e.g., the reset element 140, the amplification element 150, and the selection element 160 illustrated in FIG. 2A) may be disposed between adjacent photoelectric conversion devices 110. The reading devices may include MOS transistors. That is, the reading devices may include read gate electrodes 125 and source/drain electrodes 133, as illustrated in FIGS. 3 and 4. The read gate electrodes 125 and the source/drain electrodes 133 may be formed at the second active regions ACT2 defined in the semiconductor layer 100, as illustrated in FIG. 3. In some embodiments, the read gate electrodes 125 may be disposed on the first surface 1 of the semiconductor layer 100, and top surfaces of the read gate electrodes 125 may disposed at a higher level than a top surface of the transfer gate electrode 123. That is, a distance between the first surface 1 of the semiconductor layer 100 and the top surfaces of the read gate electrodes 125 may be different from a distance between the first surface 1 of the semiconductor layer 100 and the top surface of the transfer gate electrode 123. Further, the transfer gate electrode 123 and the read gate electrodes 125 may be formed using two separate processes/process steps. Thus, the transfer gate electrode 123 may be formed of a different material from the read gate electrodes 125.

Referring again to FIG. 4, the interconnection layer 200 may include a plurality of interlayer insulating layers 210 vertically stacked and a plurality of metal interconnections 220 disposed between the plurality of interlayer insulating layers 210. The metal interconnections 220 may be connected to the reading devices and the logic devices disposed under the metal interconnections 220 through contact plugs 215 penetrating the interlayer insulating layers 210. In addition, the metal interconnections 220 may be connected to other interconnections. In some embodiments, the metal interconnections 220 may be freely disposed regardless of the array of the photoelectric conversion devices 110. That is, the metal interconnections 220 may cross over the photoelectric conversion devices 110.

In some embodiments, the interconnection layer 200 may be disposed between the semiconductor layer 100 and a support substrate 230. The support substrate 230 may be any one of a semiconductor substrate, a glass substrate, a quartz substrate, and a plastic substrate. The support substrate 230 may be bonded to the interconnection layer 200 using an adhesive layer. The semiconductor layer 100 may warp if a thickness of the semiconductor layer 100 decreases. However, according to some embodiments herein, the semiconductor layer 100 may not be warped (or warpage may be reduced) because of the presence of the support substrate 230, even though the thickness of the semiconductor layer 100 may decrease.

In some embodiments, the light transmission layer 300 may be disposed on the second surface 2 of the semiconductor layer 100, as described above. The light transmission layer 300 may include a lower planarization layer 311, an upper planarization layer 313, color filters 320, and micro lenses 330. In some embodiments, the lower and upper planarization layers 311 and 313 may be sequentially stacked on the second surface 2, and the color filters 320 may be disposed between the lower and upper planarization layers 311 and 313. Further, the micro lenses 330 may be disposed on the upper planarization layer 313 and opposite the color filters 320. That is, the external light may be irradiated onto the second surface 2 of the semiconductor layer 100 through the micro lenses 330, thereby generating charges in the photoelectric conversion devices 110.

In some embodiments, each of the color filters 320 may be one of a red color filter, a blue color filter, and a green color filter. The color filters 320 may be disposed to correspond to the respective photoelectric conversion devices 110 formed in the semiconductor layer 100. For example, the color filters 320 may be two-dimensionally arrayed like the photoelectric conversion devices 110. The red color filters, the blue color filters and the green color filters of the color filters 320 may be disposed in a Bayer type of arrangement. Each of the color filters 320 may transmit a specific color of light onto the corresponding unit pixel to realize a color image. Accordingly, the red color filters may filter unnecessary visible rays to transmit only a red color light, and the green color filters may filter unnecessary visible rays to transmit only a green color light. Similarly, the blue color filters may filter unnecessary visible rays to transmit only a blue color light. In some embodiments, the color filters 320 may include different color filters from the red color filters, the green color filters, and the blue color filters. For example, the color filters 320 may include cyan color filters, magenta color filters, or yellow color filters.

The micro lenses 330 may be disposed to correspond to the respective unit pixels. Each of the micro lenses 330 may have a convex surface, and the convex surface may have a predetermined radius of curvature to concentrate the incident light. Also, each of the micro lenses 330 may be formed of a light-transmitting material. For example, the micro lenses 330 may be formed of thermosetting resin having a light-transmitting property.

The lower planarization layer 311 may be disposed between the semiconductor layer 100 and the color filters 320, and the upper planarization layer 313 may be disposed between the color filters 320 and the micro lenses 330. The lower and upper planarization layers 311 and 313 may be formed of a material having a refractive index greater than that of a silicon oxide material in order to improve an optical sensitivity of the image sensor. In some embodiments, the lower and upper planarization layers 311 and 313 may be formed of a material having a refractive index within the range of about 1.4 to about 4.0. For example, the lower and upper planarization layers 311 and 313 may be formed of an aluminum oxide ($Al_2O_3$) layer, a cerium fluoride ($CeF_3$) layer, a hafnium oxide ($HfO_2$) layer, an Indium Tin Oxide (ITO) layer, a magnesium oxide (MgO) layer, a tantalum pentoxide ($Ta_2O_5$) layer, a titanium dioxide ($TiO_2$) layer, a zirconium oxide ($ZrO_2$) layer, a silicon layer, a germanium layer, a zinc selenide (ZnSe) layer, a zinc sulfide (ZnS) layer, or a lead fluoride ($PbF_2$) layer. Alternatively, the lower and upper planarization layers 311 and 313 may be formed of an organic material having a high refractive index. For example, the lower and upper planarization layers 311 and 313 may be formed of a siloxane resin material, a benzocyclobutene material, a material of a polyimide system, a material of acryl system, a parylene C material, a poly(methyl methacrylate) (PMMA) material, or a polyethylene terephthalate (PET) material. Additionally, the lower and upper planarization layers 311 and 313 may be formed of a strontium titanate ($SrTiO_3$) material, a polycarbonate material, a glass material, a bromine material, a sapphire material, a cubic zirconia material, a potassium niobate ($KNbO_3$) material, a moissanite (SiC) material, a gallium phosphide (GaP) material, or a gallium arsenide (GaAs) material.

Figure 8:
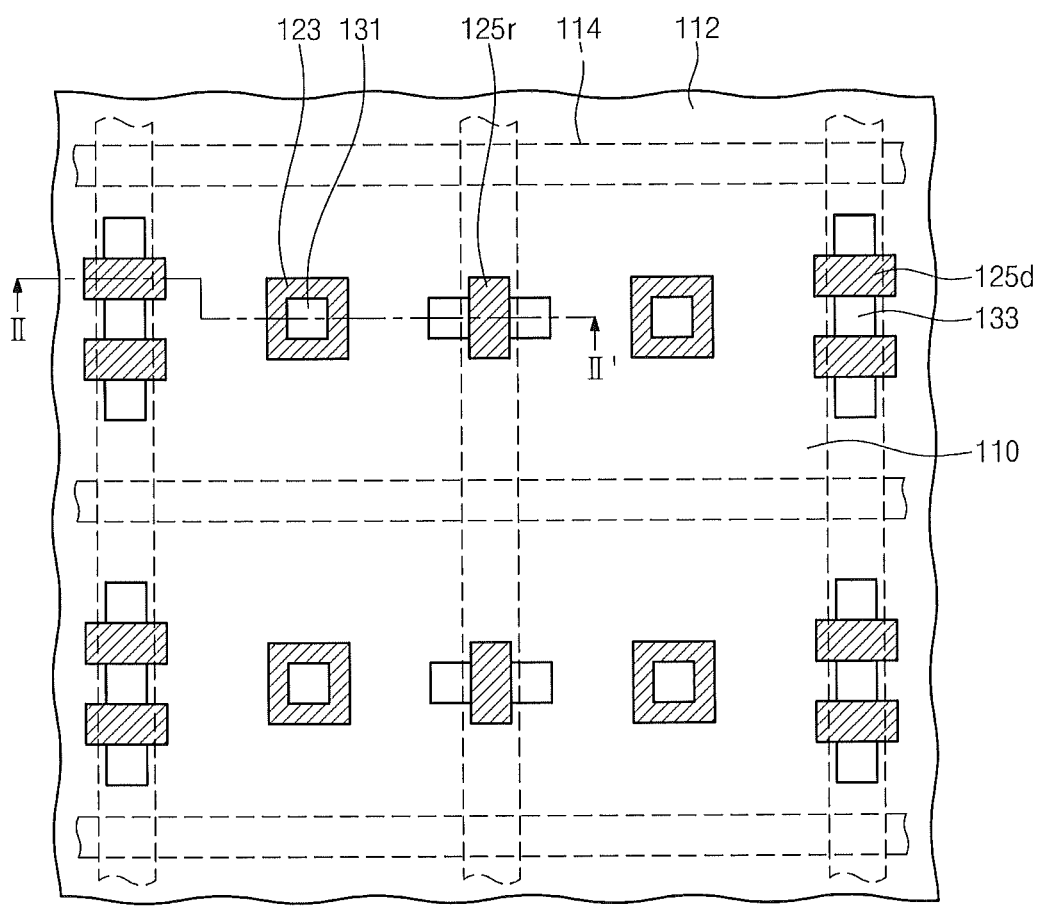
FIG. 8 is a schematic plan view illustrating an image sensor according to some embodiments.
Figure 9:
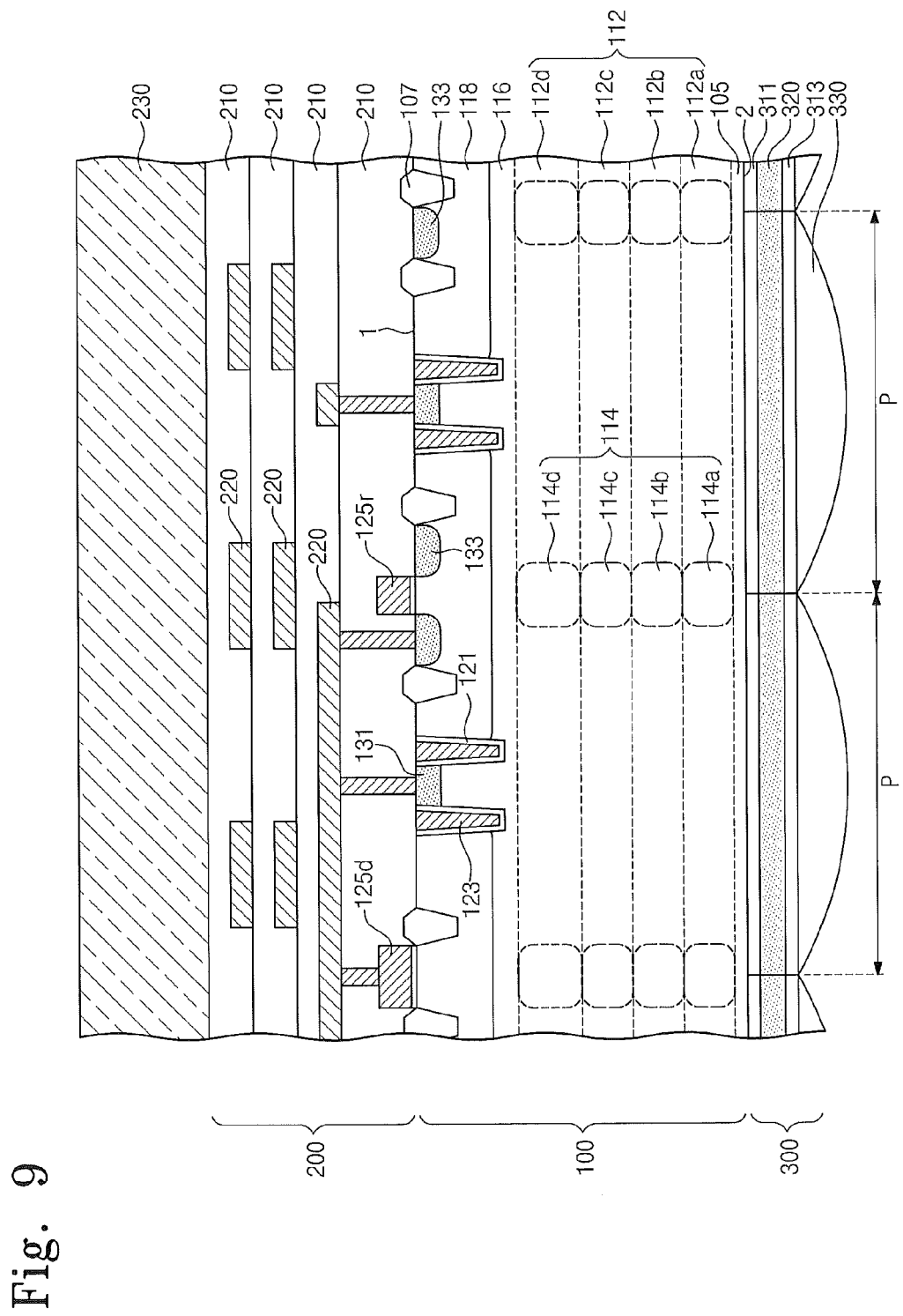
FIG. 9 is a cross-sectional view taken along line II-II' of FIG. 8 to illustrate an image sensor according to some embodiments.

FIG. 8 is a schematic plan view illustrating an image sensor according to some embodiments, and FIG. 9 is a cross-sectional view taken along a line II-II' of FIG. 8 to illustrate an image sensor according to some embodiments.

Referring to FIGS. 8 and 9, an image sensor according to some embodiments may include a semiconductor layer 100 having a first surface 1 and a second surface 2 facing/opposing each other, an interconnection layer 200 on the first surface 1 of the semiconductor layer 100, and a light transmission layer 300 on the second surface 2 of the semiconductor layer 100.

A plurality of photoelectric conversion devices 110 may be disposed in the semiconductor layer 100 and may be arrayed in a matrix form on a same plane. Each of the photoelectric conversion devices 110 may include a pinned photodiode having a PNP junction structure, as described in the embodiment of FIGS. 3 and 4. That is, the pinned photodiode may include a P-type heavily doped impurity layer 105 (or a P-type epitaxial layer), an N-type impurity layer 112, and a P-type impurity layer 116, which are vertically stacked. According to the some embodiments, the N-type impurity layer 112 may generate and store charges in response to an incident light, and a portion of the P-type impurity layer 116 may act as a path (e.g., a channel region) through which the charges are transferred.

In some embodiments, the N-type impurity layer 112 may be disposed throughout the semiconductor layer 100 (e.g., throughout a majority of the semiconductor layer 100), as illustrated in FIGS. 8 and 9. Further, P-type isolation impurity regions 114 may be disposed in the N-type impurity layer 112. The P-type isolation impurity regions 114 may divide the N-type impurity layer 112 into a plurality of separated N-type impurity layers 112. Each of the separated N-type impurity layers 112 may constitute a photoelectric conversion device 110 of a unit pixel P together with the P-type impurity layer 116. Therefore, the separated N-type impurity layers 112 may be isolated from each other by the P-type isolation impurity regions 114, and the P-type isolation impurity regions 114 may reduce/prevent the cross talk between the unit pixels P.

Each of the separated N-type impurity layers 112 may include a plurality of N-type impurity regions 112a, 112b, 112c, and 112d that are vertically stacked. Further, impurity concentrations of the plurality of N-type impurity regions 112a, 112b, 112c, and 112d may be different from each other. A slope of the electric potential profile in each separated N-type impurity layer 112 may be adjusted by controlling the impurity concentrations of the N-type impurity regions 112a, 112b, 112c, and 112d. According to some embodiments, each of the separated N-type impurity layers 112 may be designed so that a highest electric potential region in each of the separated N-type impurity layers 112 may be located to be adjacent the P-type impurity layer 116. This is for improving the efficiency with which charges in the N-type impurity layer 112 are transmitted into the floating diffusion region 131 during operation of the image sensor. For example, in order to improve the charge transmission efficiency of the image sensor, the impurity concentration in the N-type impurity layer 112 may vary to gradually decrease as a distance from the first surface 1 toward the second surface 2 increases. In other words, the shorter a distance from the P-type impurity layer 116 is, the higher the impurity concentration in the N-type impurity layer 112 is.

In the event that each of the separated N-type impurity layers 112 includes the plurality of N-type impurity regions 112a, 112b, 112c, and 112d that are vertically stacked, each of the P-type isolation impurity regions 114 may also include a plurality of P-type isolation impurity regions 114a, 114b, 114c, and 114d. Further, the impurity concentration in each P-type isolation impurity region 114 may vary to gradually decrease as a distance from the first surface 1 toward the second surface 2 increases. In addition, a depth of the P-type isolation impurity regions 114 may be substantially equal to or greater than that of the N-type impurity layer 112. That is, a vertical thickness of the P-type isolation impurity regions 114 may be substantially equal to or greater than that of the N-type impurity layer 112.

In some embodiments, transfer gate electrodes 123 may be respectively disposed at central portions of the separated N-type impurity layers 112 when viewed from a plan view. This is for increasing/improving the efficiency with which charges in the N-type impurity layer 112 are transmitted into the floating diffusion region 131 during operation of the image sensor.

Each of the transfer gate electrodes 123 may have a closed loop shape having an opening that penetrates a central portion thereof, as described with reference to FIGS. 5-7D. The transfer gate electrodes 123 may be disposed inside the semiconductor layer 100. Each of the transfer gate electrodes 123 may overlap the corresponding separated N-type impurity layer 112 in a plan view. For example, each of the transfer gate electrodes 123 may be disposed at a central portion of the separated N-type impurity layer 112 constituting the photoelectric conversion device when viewed from a plan view.

The P-type impurity layer 116 surrounded/bordered by the transfer gate electrode 123 may be doped with N-type impurities, thereby forming a floating diffusion region 131 having an N-type. The floating diffusion regions 131 may be locally formed in the P-type impurity layer 116 surrounded/bordered by the transfer gate electrodes 123. Each of the floating diffusion regions 131 may overlap the corresponding photoelectric conversion device 110 in a plan view. However, the floating diffusion regions 131 may be vertically spaced apart from the separated N-type impurity layers 112.

P-type wells 118 surrounding outer sidewalls of the transfer gate electrodes 123 may be disposed in the P-type impurity layer 116. The P-type wells 118 may be separated from the N-type impurity layer 112. Alternatively, the P-type wells 118 may be in contact with the N-type impurity layer 112. The impurity concentration of the P-type wells 118 may be greater than that of the P-type impurity layer 116. For example, the P-type impurity layer 116 may have a P-type impurity concentration within the range of about $1\times10^{14}$ atoms/cm$^3$ to about $1\times10^{17}$ atoms/cm$^3$, and the P-type wells 118 may have a P-type impurity concentration within the range of about $1\times10^{17}$ atoms/cm$^3$ to about $1\times10^{20}$ atoms/cm$^3$. The P-type wells 118 may reduce the surface defects (for example, dangling bonds) existing near the first surface 1 or electron-hole pairs thermally generated near the first surface 1, thereby suppressing the dark current. In more detail, holes of the electron-hole pairs generated near the first surface 1 may be drifted and/or diffused into the semiconductor layer 100 grounded through the P-type wells 118, and electrons of the electron-hole pairs generated near the first surface 1 may recombine with the holes (corresponding to the majority carrier) in the P-type wells 118 to disappear. Moreover, reading devices composed of MOS transistors may be disposed in the P-type wells 118. The reading devices may be formed at active regions, and the active regions may be defined by isolation layers 107 that are disposed in the P-type wells 118. That is, read gate electrodes 125r and 125d may be formed on the P-type wells 118, and gate insulating layers may be interposed between the read gate electrodes 125r and 125d and the P-type wells 118. Source/drain electrodes 133 may be disposed in the P-type wells 118 at both sides of each of the read gate electrodes 125r and 125d. In other words, referring still to FIGS. 8 and 9, the reading devices may be disposed to overlap the separated N-type impurity layers 112 when viewed from a plan view. The P-type wells 118 may reduce the dark currents of the image sensor and may act as channel regions of the reading devices, which are composed of MOS transistors.

According to some embodiments, incident light may be irradiated onto the second surface 2 (e.g., a backside surface) of the semiconductor layer 100. The layout scheme of the reading devices may not be limited to the embodiment illustrated in FIG. 8. That is, the layout scheme of the reading devices may be embodied in many different forms on the P-type wells 118 when viewed from a plan view.

The impurity concentration of the P-type impurity layer 116 surrounded/bordered by the transfer gate electrodes 123 may be lower than that of the P-type wells 118 surrounding the outer sidewalls of the transfer gate electrodes 123. Thus, an electric potential gradient may be provided due to a P-type impurity concentration difference between the P-type impurity layer 116 and the P-type wells 118. As a result, the P-type wells 118 may serve as electrical potential barriers with respect to the P-type impurity layer 116 surrounded/bordered by the transfer gate electrodes 123 so that the charges stored in the separated N-type impurity layers 112 are easily drifted and/or diffused into the floating diffusion regions 131.

Referring to FIG. 9, in the event that the P-type impurity layer 116 is disposed between the P-type wells 118 and the N-type impurity layer 112, the local P-type impurity regions 126 illustrated in FIG. 7B may be further disposed between the N-type impurity layer 112 and the bottom surfaces of the transfer gate electrodes 123. The local P-type impurity regions 126 may act as a potential barrier so that the charges in the N-type impurity layer 112 are easily drifted and/or diffused into the P-type impurity layer 116 surrounded/bordered by the transfer gate electrodes 123.

Referring again to FIG. 9, the semiconductor layer 100 may include the P-type heavily doped impurity layer 105 that is shallowly formed along the second surface 2, as described above. The P-type heavily doped impurity layer 105 may reduce the dark current that is generated due to the surface defects near the second surface 2.

Furthermore, an interconnection layer 200 may be disposed on the first surface 1 of the semiconductor layer 100, as illustrated above. The interconnection layer 200 may include devices that read the electrical signals generated in the photoelectric conversion devices and control the unit pixels. A support substrate 230 may be disposed on the interconnection layer 200 and opposite the semiconductor layer 100. In addition, a light transmission layer 300 may be disposed on the second surface 2 of the semiconductor layer 100, as described with reference to FIGS. 3 and 4. That is, the light transmission layer 300 may include a lower planarization layer 311, an upper planarization layer 313, color filters 320, and micro lenses 330. The micro lenses 330 and color filters 320 may be disposed to correspond to the respective photoelectric conversion devices.

Figure 10:
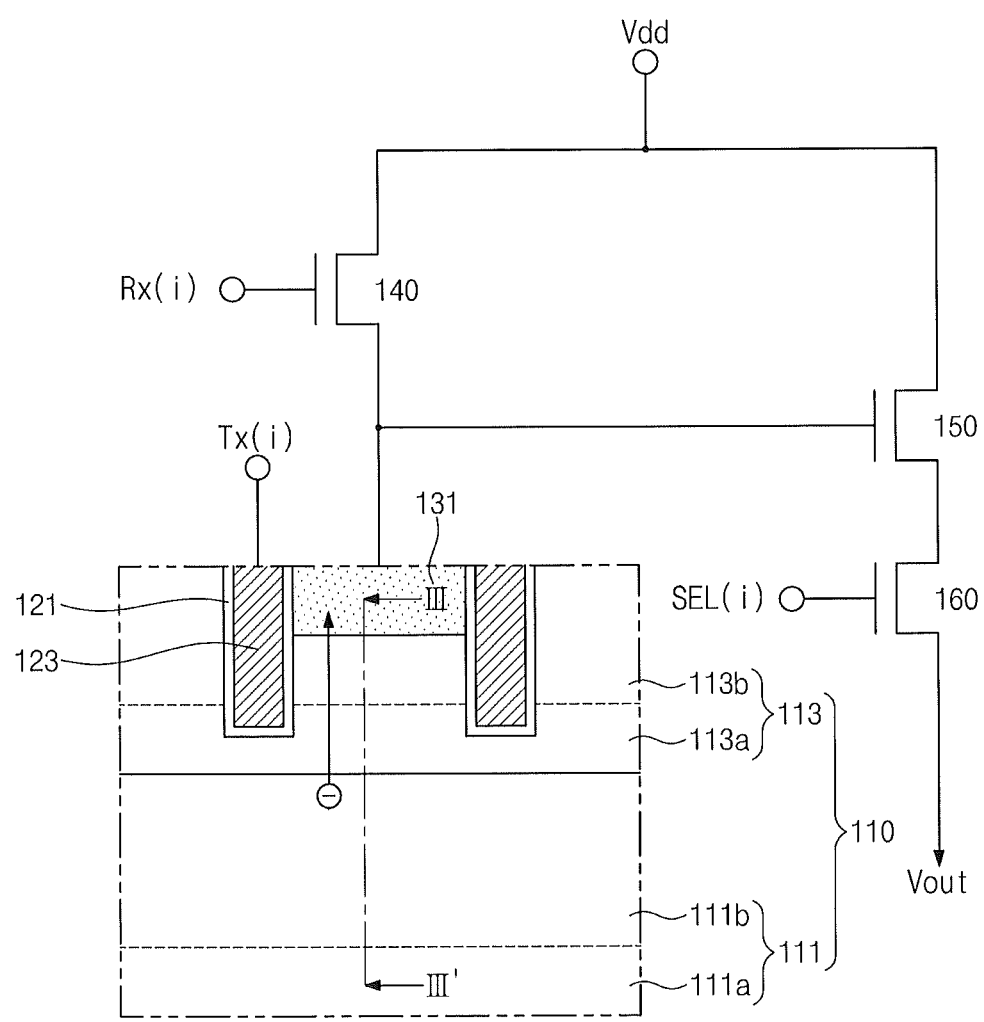
FIG. 10 is a diagram illustrating operations of an image sensor according to some embodiments.
Figure 11:
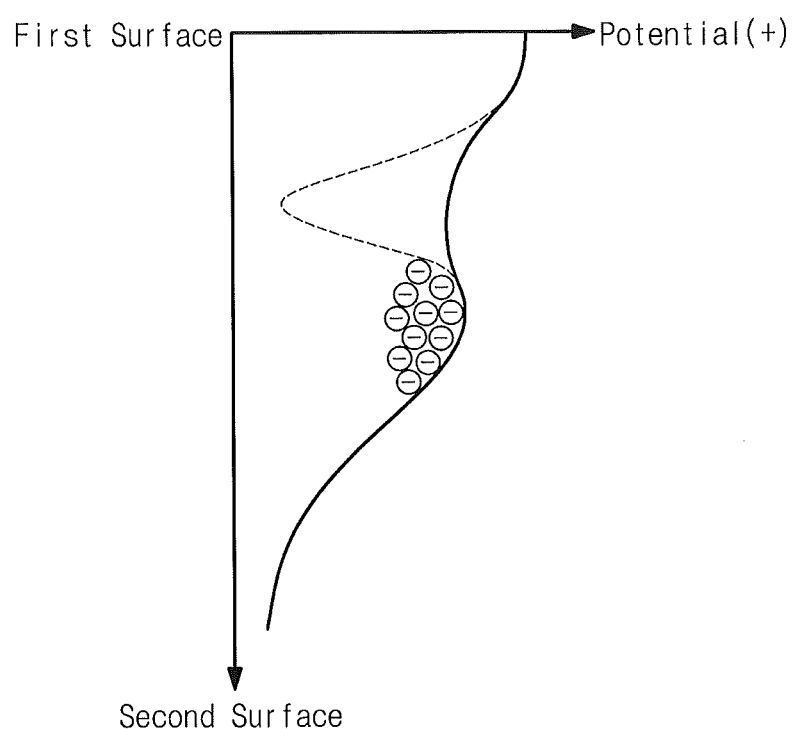
FIG. 11 is an electric potential diagram of an image sensor according to some embodiments.

FIG. 10 is a diagram illustrating operations of an image sensor according to some embodiments, and FIG. 11 is a potential diagram taken along a line of FIG. 10. In the drawing of FIG. 11, the dotted line indicates an electric potential of the semiconductor layer when a charge transmission signal is inactive, and the solid line indicates an electric potential of the semiconductor layer when a charge transmission signal is active.

Referring to FIG. 10, when an incident light is irradiated onto the photoelectric conversion devices 110 of all the unit pixels in an active pixel sensor array, electron-hole pairs may be generated in the N-type impurity layers 111 of the photoelectric conversion devices 110 and charges may be stored in the N-type impurity layers 111 of the photoelectric conversion devices 110 according to electric field applied to the photoelectric conversion devices 110. A charge transmission signal line TX(i), a reset signal line RX(i), and a row select signal line SEL(i) may be connected to the reading devices, for example, transfer gate electrodes 123, gate electrodes of reset elements 140, and gate electrodes of selection elements 160 disposed in a specific row, respectively. Further, a charge transmission signal, a reset signal, and a row select signal may be applied to the charge transmission signal line TX(i), the reset signal line RX(i), and the row select signal line SEL(i), respectively.

If the selection element 160 is activated (e.g., turned on) by the select signal and the reset element 140 is inactivated (e.g., turned off) by the reset signal, an output signal corresponding to the amount of the charges stored in the detection device (e.g., the floating diffusion region 131) may be read out through an output line Vout connected to the selected unit pixel.

In the meantime, if the reset element 140 is activated (e.g., turned on) by the reset signal, all the charges (for example, electrons) stored in the floating diffusion region 131 may be completely drifted into the power supply terminal Vdd. Thus, the selected unit pixel may be initialized.

In the event that the charge transmission signal of the initialized unit pixel is inactive, a potential barrier height of the P-type impurity layer 113 surrounded/bordered by the transfer gate electrode 123 may increase and charges may be accumulated in the N-type impurity layer 111 of the photoelectric conversion device 110.

If the charge transmission element including the transfer gate electrode 123 is activated by the charge transmission signal and the reset element 140 is inactivated, the potential barrier height of the P-type impurity layer 113 surrounded/bordered by the transfer gate electrode 123 may be lowered and charges stored in the N-type impurity layer 111 may be transmitted into the floating diffusion region 131. According to some embodiments, the floating diffusion region 131 may be disposed vertically over the N-type impurity layer 111. Thus, electrons stored in the N-type impurity layer 111 may be upwardly moved from the second surface 2 toward the first surface 1. In other words, the charges such as electrons stored in the N-type impurity layer 111 may be transmitted into the floating diffusion region 131 across the semiconductor layer 100 in a vertical direction. The floating diffusion region 131 may have a parasitic capacitance. Thus, the electric potential of the floating diffusion region 131 may be determined according to the amount of the charges stored in the floating diffusion region 131, and the output current of the amplification element 150 may be determined according to the electric potential of the floating diffusion region 131.

Subsequently, if the selection element 160 is activated by the select signal applied to the select signal line SEL(i), the output signal of the selected unit pixel may be read out through the output line Vout connected to the selected unit pixel.

FIGS. 12 to 19 are cross-sectional views illustrating methods of fabricating image sensors according to some embodiments.

Figure 12:
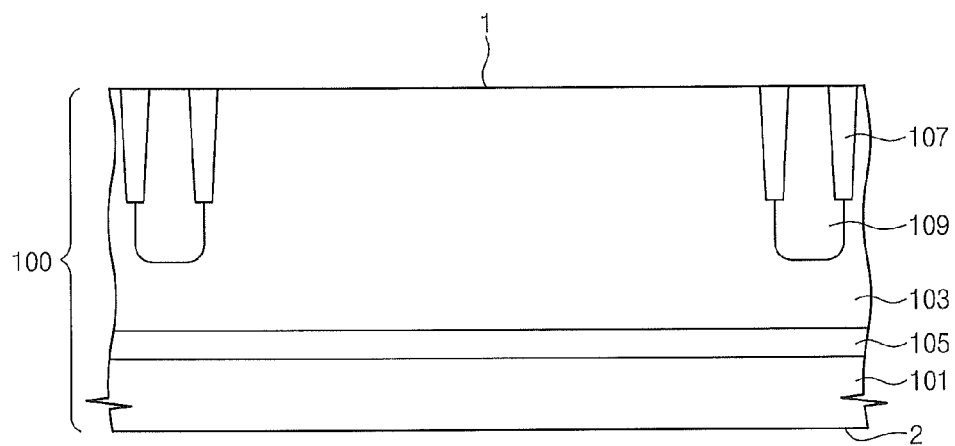
FIGS. 12 to 19 are cross-sectional views illustrating methods of fabricating image sensors according to some embodiments.

Referring to FIG. 12, a semiconductor layer 100 may be provided, and an isolation layer 107 defining active regions may be formed in the semiconductor layer 100. The semiconductor layer 100 may include a P-type bulk substrate 101 and a P-type epitaxial layer 103 formed on the P-type bulk substrate 101.

In some embodiments, a surface of the P-type epitaxial layer 103 opposite the P-type bulk substrate 101 may be referred to as a first surface 1 (or a front side surface) of the semiconductor layer 100, and a surface of the P-type bulk substrate 101 opposite the P-type epitaxial layer 103 may be referred to as a second surface 2 (or a back side surface) of the semiconductor layer 100. According to some embodiments, the semiconductor layer 100 may include the P-type bulk substrate 101 and the P-type epitaxial layer 103 on the P-type bulk substrate 101, as described above. However, the semiconductor layer 100 is not limited to the above structure. For example, the P-type bulk substrate 101 may be replaced with an N-type bulk substrate. Alternatively, the semiconductor layer 100 may include a bulk substrate and a P-type well formed in the bulk substrate. Moreover, the semiconductor layer 100 may be a silicon-on-insulator (SOI) substrate. Accordingly, the semiconductor layer 100 may be embodied in many different forms.

P-type impurities may be implanted into the P-type epitaxial layer 103, thereby forming a P-type deep well 105 that is heavily doped with the P-type impurities. The P-type deep well 105 may be spaced apart from the first surface 1 to intervene between the P-type epitaxial layer 103 and the bulk substrate 101. An impurity concentration of the P-type deep well 105 may be higher than that of the P-type epitaxial layer 103. For example, the P-type deep well 105 may have a depth of about 3 μm to 12 μm and an impurity concentration of about $1 \times 10^{15}$ atoms/cm$^3$ to about $1 \times 10^{20}$ atoms/cm$^3$.

The isolation layer 107 may be formed to define first active regions ACT1 and second active regions ACT2, as described with reference to FIG. 3. The isolation layer 107 may be formed at (e.g., may be formed so as to define) the first surface 1 of the semiconductor layer 100 using a shallow trench isolation technique or a local oxidation of silicon (LOCOS) technique.

In some embodiments, P-type isolation wells 109 may be formed in the semiconductor layer 100 after formation of the isolation layer 107. The P-type isolation wells 109 may be formed to contact the P-type deep well 105. The P-type isolation wells 109 may have an impurity concentration of about $1 \times 10^{15}$ atoms/cm$^3$ to about $1 \times 10^{20}$ atoms/cm$^3$.

Figure 13:
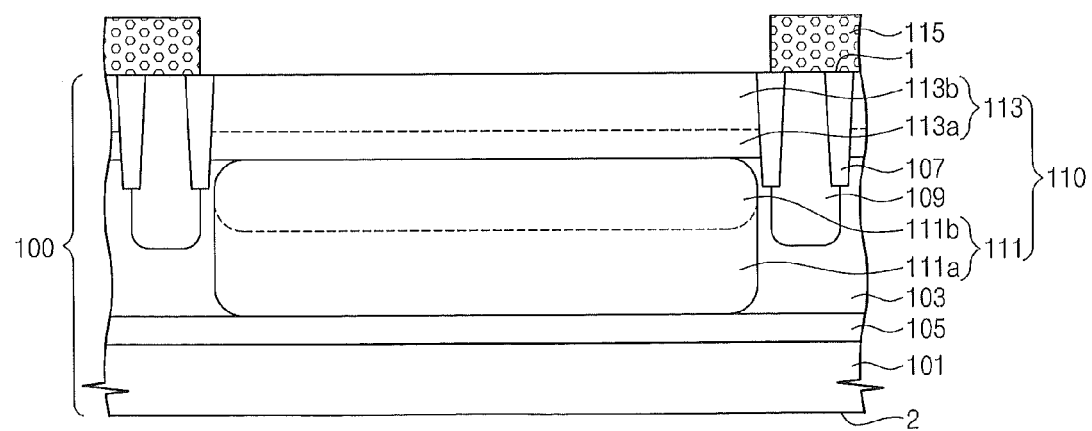

Referring to FIG. 13, a photoelectric conversion device 110 may be formed in the semiconductor layer 100. In some embodiments, the photoelectric conversion device 110 may include a pinned photodiode.

Forming the photoelectric conversion device 110 may include forming a first mask pattern 115 on the first surface 1 of the semiconductor layer 100 to expose the first active region ACT1 and forming an N-type impurity layer 111 and a P-type impurity layer 113 in the semiconductor layer 100 using the first mask pattern 115.

In more detail, N-type impurities may be implanted into the P-type epitaxial layer 103 using the first mask pattern 115 as an implantation mask, thereby forming the N-type impurity layer 111. The N-type impurity layer 111 may be formed to include a first impurity layer 111a and a second impurity layer 111b that are sequentially stacked. That is, the second impurity layer 111b may be formed to be closer to the first surface 1 than the first impurity layer 111a is to the first surface 1. An impurity concentration of the first impurity layer 111a may be lower than that of the second impurity layer 111b. For example, the first impurity layer 111a may have an impurity concentration of about $1 \times 10^{15}$ atoms/cm$^3$ to about $1 \times 10^{17}$ atoms/cm$^3$, and the second impurity layer 111b may have an impurity concentration of about $1 \times 10^{17}$ atoms/cm$^3$ to about $1 \times 10^{20}$ atoms/cm$^3$.

Subsequently, P-type impurities may be implanted into the P-type epitaxial layer 103 using the first mask pattern 115 as an implantation mask, thereby forming the P-type impurity layer 113 adjacent the first surface 1 and located on the N-type impurity layer 111. The P-type impurity layer 113 may be formed to include a potential barrier region 113a and a surface impurity region 113b that are sequentially stacked. The surface impurity region 113b may be formed to be closer to the first surface 1 than the potential barrier region 113a is to the first surface 1. An impurity concentration of the surface impurity region 113b may be higher than that of the potential barrier region 113a. For example, the potential barrier region 113a may have an impurity concentration of about $1 \times 10^{14}$ atoms/cm$^3$ to about $1 \times 10^{17}$ atoms/cm$^3$, and the surface impurity region 113b may have an impurity concentration of about $1 \times 10^{17}$ atoms/cm$^3$ to about $1 \times 10^{20}$ atoms/cm$^3$.

The first mask pattern 115 may be removed after formation of the photoelectric conversion device 110.

Figure 14:
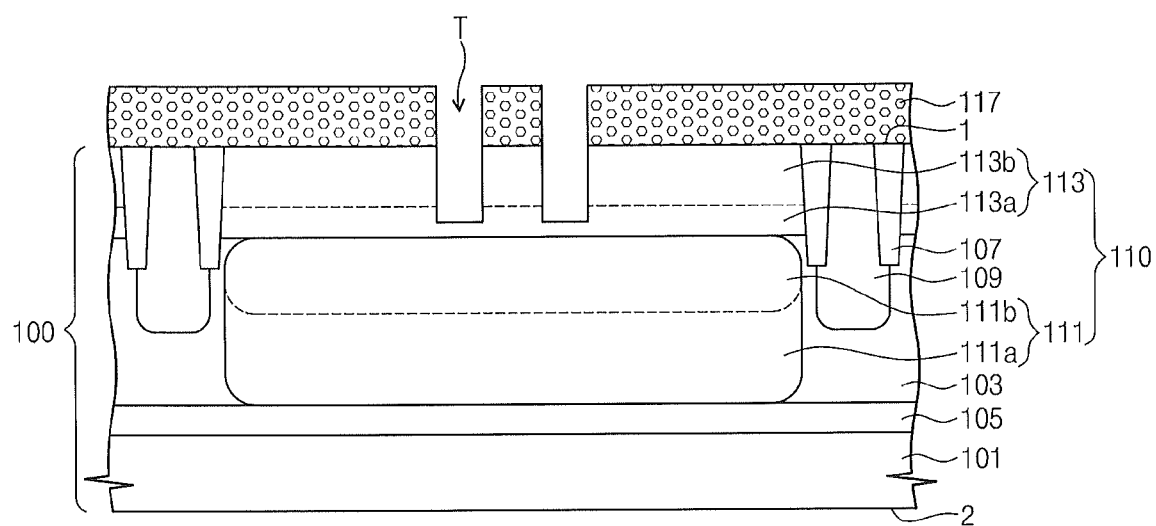
Figure 15:
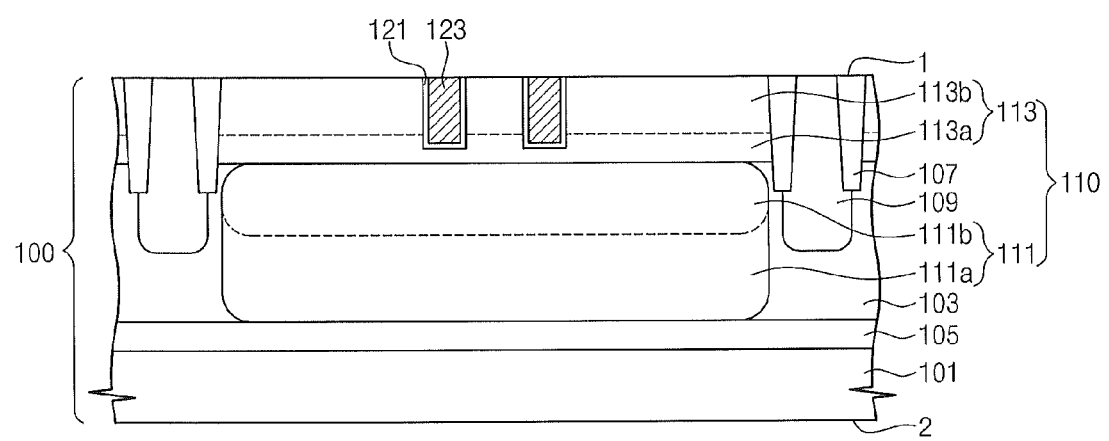

Referring to FIGS. 14 and 15, a transfer gate electrode 123 may be formed inside the semiconductor layer 100. The transfer gate electrode 123 may be formed to have a closed loop shape in a plan view. That is, the transfer gate electrode 123 may have a hollow region corresponding to an opening that penetrates a central portion thereof. Forming the transfer gate electrode 123 may include forming a trench T in the semiconductor layer 100, forming a gate insulating layer 121 on an inner wall of the trench T, and filling the trench T with a conductive material.

More specifically, a second mask pattern 117 may be formed on the first surface 1 of the semiconductor layer 100, as illustrated in FIG. 14. The second mask pattern 117 may be formed to expose a predetermined region of the first surface 1 within a central region of the photoelectric conversion device 110.

The semiconductor layer 100 may be etched by a predetermined depth using the second mask pattern 117 as an etch mask, thereby forming the trench T in the semiconductor layer 100. The trench T may be formed using an anisotropic etching technique.

A bottom surface of the trench T may be located inside the P-type impurity layer 113 and may expose the potential barrier region 113a. Alternatively, the bottom surface of the trench T may be located at an interface between the P-type impurity layer 113 and the N-type impurity layer 111, as illustrated in FIG. 7C. In some embodiments, the trench T may be formed so that the bottom surface of the trench T is located inside the N-type impurity layer 111, as illustrated in FIG. 7D. Accordingly, the trench T may be modified to have diverse configurations and/or shapes.

Referring to FIG. 15, a gate insulating layer 121 having a thickness of about 10 Å to about 100 Å may be formed on an inner wall of the trench T.

In some embodiments, the gate insulating layer 121 may be formed using a thermal oxidation process. That is, the gate insulating layer 121 may be formed of a thermal oxide layer. The thermal oxide layer may be formed by applying a dry oxidation technique or a wet oxidation technique to the substrate where the inner wall of the trench T is exposed. The dry oxidation technique may be performed using an oxygen gas as a process gas, and the wet oxidation technique may be performed using steam ($H_2O$) as a source material. When the gate insulating layer 121 is formed using the thermal oxidation process, the gate insulating layer 121 may be selectively formed on the inner wall of the trench T.

According to some embodiments, the gate insulating layer 121 may be formed of a silicon dioxide ($SiO_2$) layer, a silicon oxynitride (SiON) layer, a silicon nitride (SiN) layer, an aluminum oxide ($Al_2O_3$) layer, a silicon nitride ($Si_3N_4$) layer, a germanium oxynitride ($Ge_xO_yN_z$) layer, a germanium silicon oxide ($Ge_xSi_yO_z$) layer or a high-k dielectric layer. The high-k dielectric layer may be formed of a hafnium oxide ($HfO_2$) layer, a zirconium oxide ($ZrO_2$) layer, a tantalum pentoxide ($Ta_2O_5$) layer, a hafnium silicate (HfSiO) layer, a zirconium silicate (ZrSiO) layer or a combination thereof using an atomic layer deposition (ALD) technique. Further, the gate insulating layer 121 may be formed of a combination layer including at least two stacked layers among the above-listed layers. The gate insulating layer 121 may be formed using a deposition technique that exhibits an excellent step coverage. For example, the gate insulating layer 121 may be formed using a chemical vapor deposition (CVD) technique or an atomic layer deposition (ALD) technique.

The second mask pattern 117 may be removed prior to formation of the gate insulating layer 121. In this case, the gate insulating layer 121 may be formed not only on the inner wall of the trench T but also on the first surface 1 of the semiconductor layer 100.

In some embodiments, prior to formation of the gate insulating layer 121, P-type impurities may be implanted into the semiconductor layer 100 under the trench T, thereby forming a local impurity region 126 (e.g., as illustrated in FIGS. 7B to 7D). The local impurity region 126 may be formed to have an impurity concentration of about $1 \times 10^{17}$ atoms/cm³ to about $1 \times 10^{20}$ atoms/cm³.

The local impurity region 126 may be formed to have an electric potential higher than an electric potential of the P-type impurity layer 113 surrounded/bordered by the transfer gate electrode 123. This may increase/improve charge transmission efficiency. That is, the local impurity region 126 may act as a potential barrier so that charges in the N-type impurity layer 111 are easily drifted and/or diffused into the P-type impurity layer 113 surrounded/bordered by the transfer gate electrode 123. Meanwhile, charges generated at a surface of the semiconductor layer 100 exposed by the trench T may be diffused into the N-type impurity layer 111. In this case, a dark current may flow. However, according to some embodiments, the dark current may be reduced/suppressed because of the presence of the local impurity region 126. In some embodiments, the local impurity region 126 may be formed using a tilted ion implantation process. In this case, the local impurity region 126 may be formed to be adjacent the sidewall of the trench T (e.g., as illustrated in FIG. 7D).

Referring again to FIG. 15, the trench T surrounded by the gate insulating layer 121 may be filled with a conductive material. The conductive material in the trench T may provide a transfer gate electrode 123.

Specifically, the transfer gate electrode 123 may be formed by depositing a gate conductive layer filling the trench T on the second mask pattern 117 and planarizing the gate conductive layer to a top surface of the second mask pattern 117. That is, the gate conductive layer may be formed prior to removal of the second mask pattern 117. The gate conductive layer may be planarized using an anisotropic etching technique (e.g., a blanket etch back process) or a chemical mechanical polishing (CMP) technique. In the event that the gate conductive layer is planarized using an anisotropic etching technique (e.g., a blanket etch back process), the transfer gate electrode 123 may be recessed in the trench T. In this case, a capping insulation layer 124 may be formed to fill the trench T on the recessed transfer gate electrode 123.

In some embodiments, the gate conductive layer may be formed of a doped polysilicon layer or a metal layer. The metal layer for forming the gate conductive layer may include a tungsten layer, a titanium layer, or a titanium nitride layer.

Figure 16:
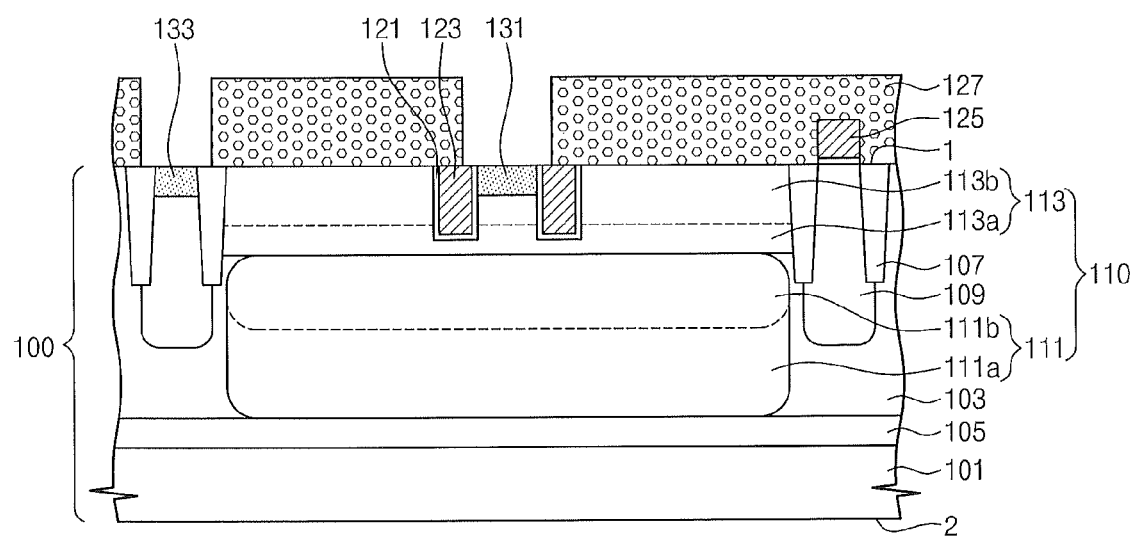

Referring to FIG. 16, gate electrodes 125 of reading devices composed of MOS transistors may be formed at the second active regions (e.g., ACT2 of FIG. 3). That is, the gate electrodes 125 of the reading devices may correspond to the gate electrodes of reset elements, amplification elements, and selection elements.

A third mask pattern 127 may be formed on the first surface 1 of the semiconductor layer 100 and the gate electrodes 125. The third mask pattern 127 may be formed to expose the P-type impurity layer 113 surrounded/bordered by the transfer gate electrode 123.

N-type impurities may be implanted into the P-type impurity layer 113 of the semiconductor layer 100 using the third mask pattern 127 as an ion implantation mask, thereby forming a floating diffusion region 131. Thus, the floating diffusion region 131 may be vertically self-aligned with the hollow region of the transfer gate electrode 123.

In the meantime, the third mask pattern 127 may additionally expose predetermined regions of the second active regions (e.g., ACT2 of FIG. 3) defined in the semiconductor layer 100 in order to form source/drain electrodes 133 of the reading devices composed of MOS transistors. In this case, the source/drain electrodes 133 and the floating diffusion region 131 may be simultaneously formed.

The third mask pattern 127 may be removed after formation of the floating diffusion region 131.

Figure 17:
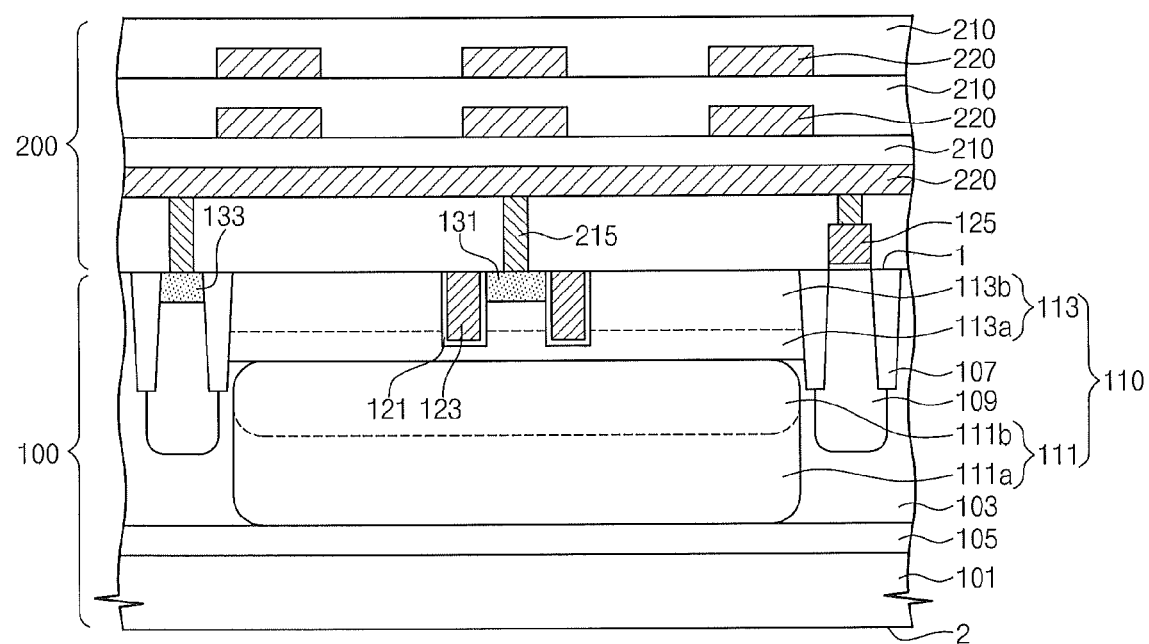

Referring to FIG. 17, an interconnection layer 200 may be formed on the first surface 1 of the semiconductor layer 100 having the photoelectric conversion device 110 and the floating diffusion region 131. Forming the interconnection layer 200 may include forming interconnections electrically connecting the reading devices that transmit and read an electric signal generated from the photoelectric conversion device 110 and forming a plurality of interlayer insulating layers 210.

More specifically, an interlayer insulating layer 210 may be formed on the first surface 1 of the semiconductor layer 100, and metal interconnections 220 may be formed on the interlayer insulating layer 210 to connect the reading devices to the control devices. The interlayer insulating layer 210 and the metal interconnections may be alternately and repeatedly stacked on the first surface 1 of the semiconductor layer 100. In some embodiments, the metal interconnections 220 may be freely disposed regardless of the array of the photoelectric conversion devices 110. That is, the metal interconnections 220 may be formed to cross over the photoelectric conversion device 110. In other words, the layout scheme of the metal interconnections 220 may be freely designed and/or embodied without any limitations on the positions of the photoelectric conversion devices 110.

The interlayer insulating layer 210 may be formed of a material having excellent gap fill characteristics and may be formed to have a flat top surface. For example, the interlayer insulating layer 210 may be formed of a high density plasma (HDP) oxide layer, a Tonen SilaZene (TOSZ) layer, a silicon on glass (SOG) layer, or an undoped silicate glass (USG) layer.

The metal interconnections 220 may be formed by depositing a metal layer on the interlayer insulating layer 210 and patterning the metal layer. The metal interconnections 220 may be formed of a copper layer, an aluminum layer, a tungsten layer, a titanium layer, a molybdenum layer, a tantalum layer, a titanium nitride layer, a tantalum nitride layer, a zirconium nitride layer, a tungsten nitride layer, or a combination thereof. The metal interconnections 220 may be electrically connected to the control device formed on the first surface 1 of the semiconductor layer 100 through contact plugs 215.

Figure 18:
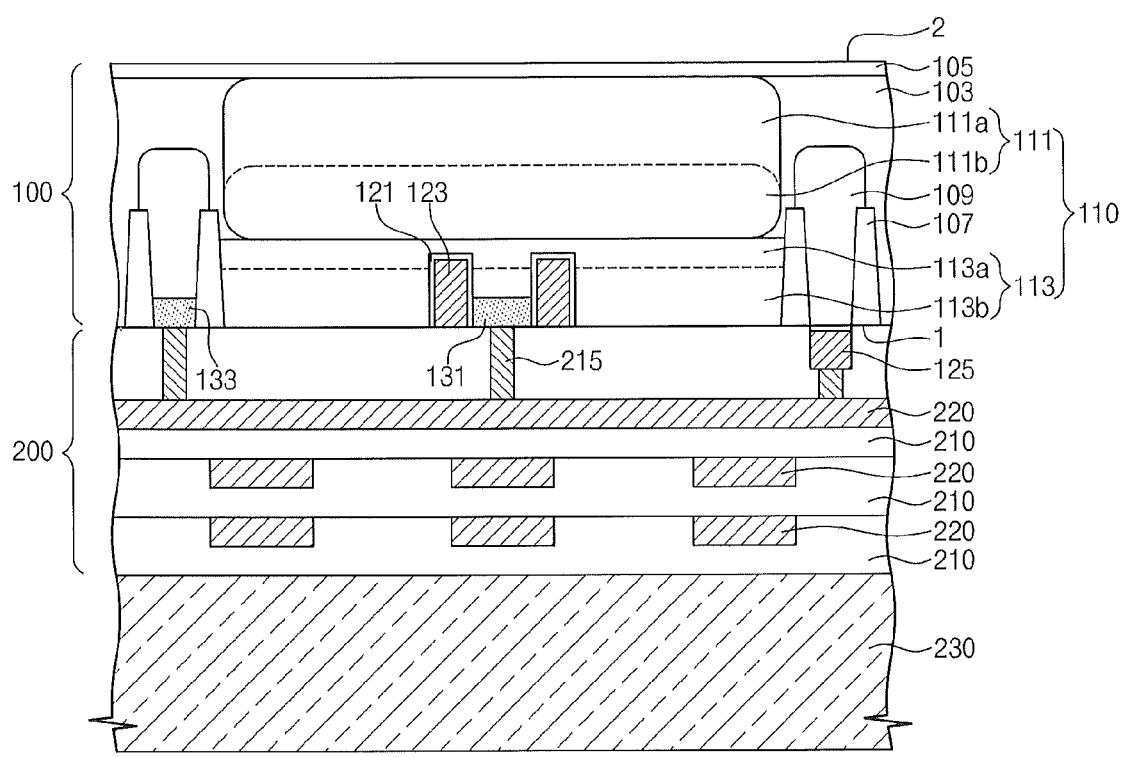

Referring to FIG. 18, a support substrate 230 may be bonded to a surface of the interconnection layer 200 opposite the semiconductor layer 100.

Specifically, the support substrate 230 may be bonded to a planarized surface of a topmost interlayer insulating layer 210 opposite the semiconductor layer 100. The support substrate 230 may support the semiconductor layer 100 during a subsequent process for thinning the semiconductor layer 100. Further, the support substrate 230 may reduce/prevent structures of the devices formed in the semiconductor layer 100 from being transformed. In some embodiments, the support substrate 230 may include a bulk substrate (e.g., a wafer) or a plastic substrate.

Referring still to FIG. 18, the semiconductor layer 100 having the photoelectric conversion device 110 may be thinned. On the other hand, in the event that the incident light is irradiated onto the second surface 2 of the semiconductor layer 100 and the semiconductor layer 100 is relatively thick, the intensity of the incident light may be significantly reduced while the incident light passes through the semiconductor layer 100. That is, loss of the incident light may be proportional to the thickness of the semiconductor layer 100. Thus, if a portion of the semiconductor layer 100 is removed to reduce a thickness of the semiconductor layer 100, a length of a path of the incident light travelling in the semiconductor layer 100 may decrease to enhance a photo sensitivity of the photoelectric conversion device 110. Further, a penetration depth of the incident light into the semiconductor layer 100 may vary according to the wavelength of the incident light. Thus, the final thickness of the semiconductor layer 100 after the thinning process may be determined according to the wavelength of the incident light.

Thinning the semiconductor layer 100 may include grinding or polishing the bulk substrate 101 and anisotropically and/or isotropically etching the grinded or polished bulk substrate 101. In some embodiments, a substrate having the support substrate 230 may be upside-down such that the support substrate 230 is located at a lowermost level. The bulk substrate 101 may be removed using a grinder or a CMP apparatus. That is, the P-type bulk substrate 101 may be mechanically removed using the grinding process or the CMP process. After mechanically removing the P-type bulk substrate 101, the remaining semiconductor layer 100 may be etched using the anisotropic etching process and/or the isotropic etching process to accurately control the thickness of the semiconductor layer 100. For example, the remaining semiconductor layer 100 may be wet-etched using a mixture of a hydrofluoric (HF) acid solution, a nitric ($HNO_3$) acid solution, and a acetic acid solution. In the event that the P-type deep well 105 is formed in the P-type epitaxial layer 103, the P-type deep well 105 may be used as an etch stop layer during the thinning process. In some embodiments, the P-type deep well 105 may also be removed during the thinning process.

As described above, the P-type bulk substrate 101 and the heavily doped P-type deep well 105 may be removed from the semiconductor layer 100 during the thinning process. In this case, the P-type epitaxial layer 103 may be exposed after the thinning process. After the thinning process, the remaining P-type epitaxial layer 103 may have a thickness of about 1 μm to about 10 μm. Alternatively, a portion or an entire portion of the P-type deep well 105 may still remain even after the thinning process, as illustrated in FIG. 18.

After the thinning process, the remaining P-type epitaxial layer 103 may have a first surface adjacent the interconnection layer 200 and a second surface opposite to the first surface 1. The second surface of the remaining P-type epitaxial layer 103 may be exposed after the thinning process. The first and second surfaces of the remaining P-type epitaxial layer 103 may correspond to the first and second surfaces 1 and 2 of the semiconductor layer 100, respectively. The second surface 2 of the P-type epitaxial layer 103 may be spaced apart from the N-type impurity layer 111 of the photoelectric conversion device 110.

While the semiconductor layer 100 is thinned using the grinding process or the CMP process, crystalline defects may be generated due to mechanical and chemical attacks. That is, the crystalline defects may exist in the P-type epitaxial layer 103 near the second surface 2 exposed by the grinding process or the CMP process. For example, surface defects such as dangling bonds or broken bonds maybe generated near the second surface 2 of the P-type epitaxial layer 103. The surface defects existing near the second surface 2 may cause a dark current of the image sensor. That is, the surface defects may degrade low illumination characteristics of the image sensor. Thus, a process for removing the surface defects near the second surface 2 of the semiconductor layer 100 (e.g., the P-type epitaxial layer 103) may be performed after the thinning process. The surface defects near the second surface 2 may be removed using a chemical etching technique, for example, a wet etching process or a chemical cleaning process. In this case, after removal of the surface defects, a native oxide layer may be formed on the second surface 2 that is etched or cleaned by the chemical etching technique. Alternatively, the surface defects near the second surface 2 may be removed by forming a buffer insulating layer on the second surface 2. The buffer insulating layer may be a thermal oxide layer formed using a thermal oxidation process. The thermal oxidation process may be performed using a dry oxidation process employing an oxygen gas as a source material or a wet oxidation process employing steam ($H_2O$) as a source material. In some embodiments, the buffer insulating layer may be formed of a chemical vapor deposition (CVD) oxide layer. According to some embodiments, the buffer insulating layer may be formed of a chemical oxide layer. The chemical oxide layer may be formed using a chemical solution consuming a silicon material at a low temperature so that the surface defects in the P-type epitaxial layer 103 are removed without any influences on the interconnection layer 200 formed on the first surface 1 of the P-type epitaxial layer 103. For example, the chemical solution may include a mixture of ammonium hydroxide, hydro-peroxide, and de-ionized water, a mixture of hydrochloride, hydro-peroxide, and de-ionized water, or a mixture of ozone and de-ionized water.

In the event that the semiconductor layer 100 is thinned to leave only the P-type epitaxial layer 103, a P-type heavily doped impurity layer may be formed in the P-type epitaxial layer 103 near the second surface 2. In some embodiments, the P-type heavily doped impurity layer may be formed by forming a material layer containing P-type impurities directly on the second surface 2 of the P-type epitaxial layer 103, and diffusing the P-type impurities into the P-type epitaxial layer 103. The material layer containing the P-type impurities may be an insulating layer. For example, the P-type impurities may correspond to boron ions, and the material layer containing the P-type impurities may correspond to a borosilicate glass (BSG) layer. After formation of the material layer containing the P-type impurities, the boron ions may be diffused into the P-type epitaxial layer 103 using a thermal annealing process or a laser annealing process. As a result, the P-type heavily doped impurity layer may be formed in the P-type epitaxial layer 103 near the second surface 2, as mentioned above. The P-type heavily doped impurity layer may also reduce the dark current that is generated due to the surface defects in the P-type epitaxial layer 103.

Figure 19:
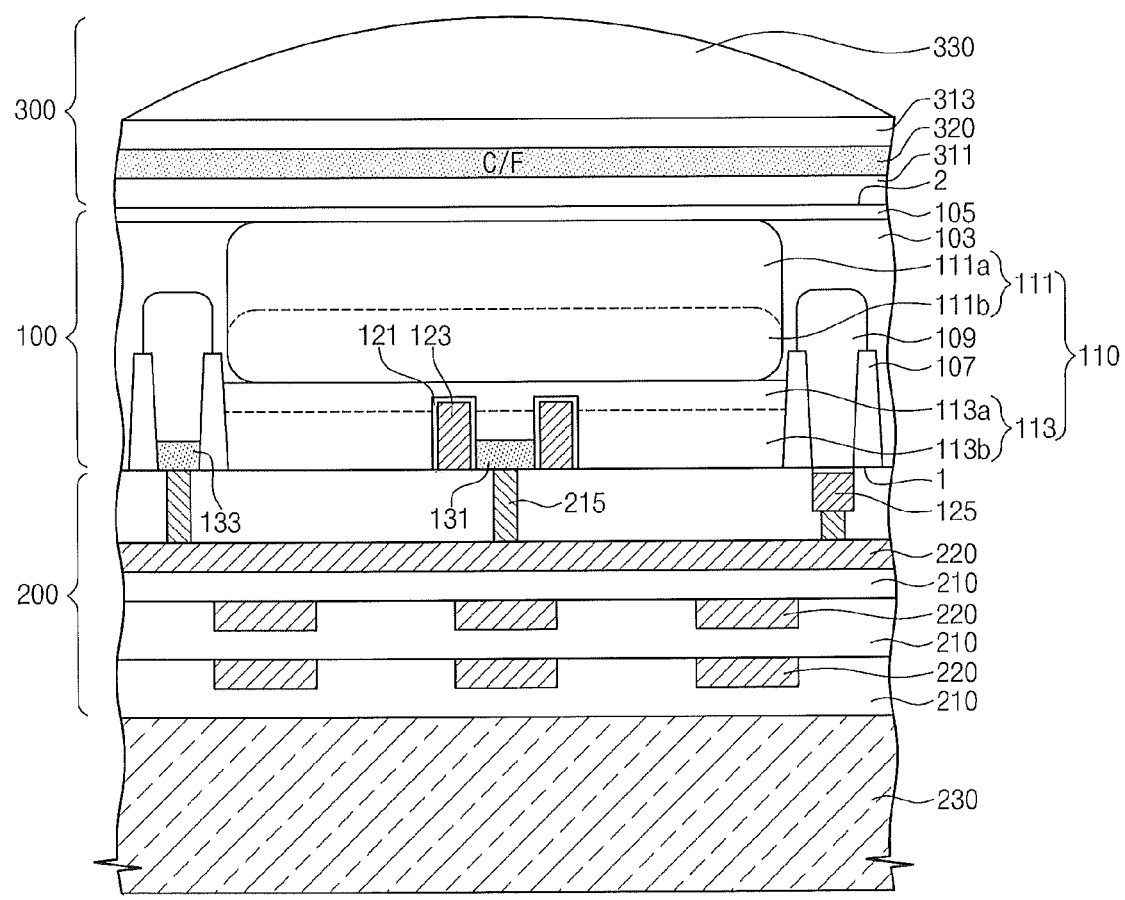

Referring to FIG. 19, a light transmission layer 300 may formed on the second surface 2 of the thinned semiconductor layer 100. The light transmission layer 300 may be formed to include a lower planarization layer 311, a color filter (C/F) layer including a plurality of color filters 320, an upper planarization layer 313, and a lens layer including a plurality of micro lenses 330 that are sequentially stacked.

The lower planarization layer 311 may be formed of a material having a refractive index that is greater than that of a silicon oxide material. As such, the photosensitivity of the image sensor may be improved/increased. For example, the lower planarization layer 311 may be formed of a material having a refractive index of about 1.4 to about 4.0. In some embodiments, the lower planarization layer 311 may be formed of an $Al_2O_3$ layer, a $CeF_3$ layer, a $HfO_2$ layer, an Indium Tin Oxide (ITO) layer, an MgO layer, a $Ta_2O_5$ layer, a $TiO_2$ layer, a $ZrO_2$ layer, a silicon layer, a germanium layer, a ZnSe layer, a ZnS layer, or a $PbF_2$ layer. Alternatively, the lower planarization layer 311 may be formed of an organic material having a high refractive index. For example, the lower planarization layer 311 may be formed of a siloxane resin material, a benzocyclobutene material, a material of a polyimide system, a material of an acryl system, a parylene C material, a poly(methyl methacrylate) (PMMA) material, or a polyethylene terephthalate (PET) material.

Color filters 320 may be formed on the lower planarization layer 311. The color filters 320 may be formed to correspond to respective ones of the photoelectric conversion devices 110. The color filters 320 may be formed using a dyeing process, a pigment dispersion process, a printing process, or the like. In some embodiments, the respective color filters 320 may be formed of a photoresist layer dyed with a color corresponding to the respective unit pixels. For example, each of the color filters 320 may be formed of any one of a red color filter, a green color filter, and a blue color filter. Alternatively, the color filters 320 may include cyan color filters, magenta color filters, or yellow color filters. The color filters 320 may be two-dimensionally arrayed like the photoelectric conversion devices 110. In addition, the color filters 320 may be arrayed in a Bayer type of arrangement.

Micro lenses 330 may be formed on respective ones of the color filters 320 opposite the lower planarization layer 311. The micro lenses 330 may be formed of a light transmittal photoresist layer. Specifically, forming the micro lenses 330 may include forming light transmittal photoresist patterns over the respective photoelectric conversion devices 110 and reflowing the light transmittal photoresist patterns. As a result, each of the micro lenses 330 may be formed to have a convex top surface with a specific radius of curvature.

A process for removing residues on the top surfaces of the micro lenses 330 may be performed after reflowing the light transmittal photoresist patterns. Subsequently, the micro lenses 330 may be baked to maintain the shape thereof.

In some embodiments, an upper planarization layer 313 may be formed on the color filters 320 opposite the lower planarization layer 311, prior to formation of the micro lenses 330. The upper planarization layer 313 may be formed of a material having an excellent light transmission property. For example, upper planarization layer 313 may be formed of a material of a polyimide system or a material of a poly-acryl system.

Figure 20:
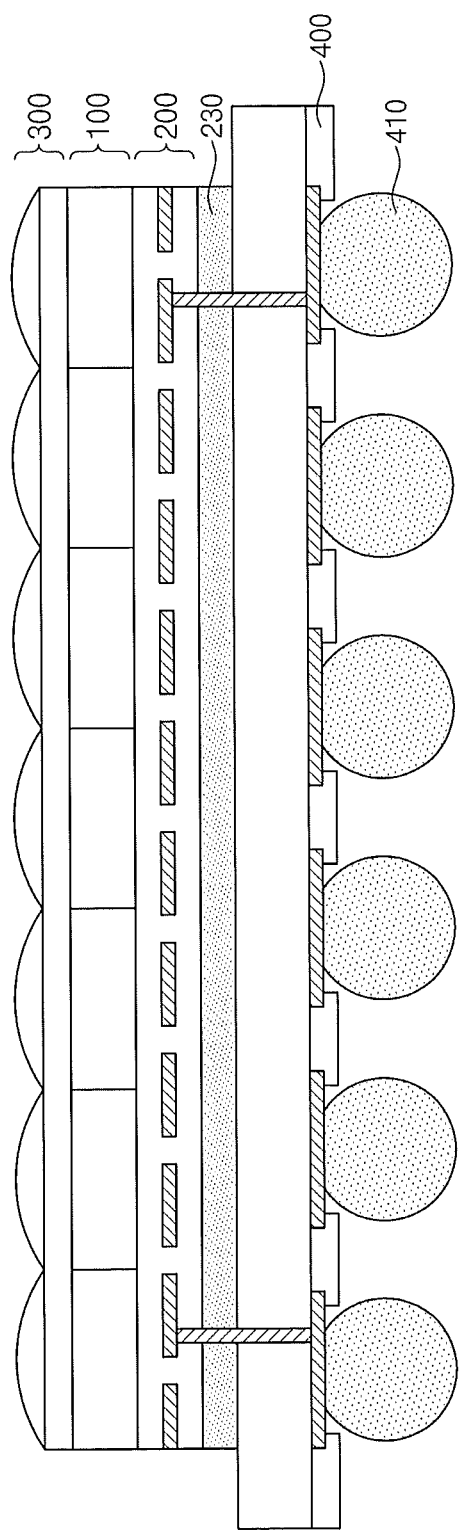
FIG. 20 is a cross-sectional view illustrating a semiconductor chip including an image sensor according to some embodiments.

FIG. 20 is a cross-sectional view illustrating an image sensor chip including an image sensor according to some embodiments.

Referring to FIG. 20, the image sensor chip may include an interconnection substrate including circuit interconnection lines and an image sensor mounted on the interconnection substrate.

Specifically, the image sensor may include a semiconductor layer 100, an interconnection layer 200, and a light transmission layer 300, as described above. In some embodiments, the semiconductor layer 100 may be disposed between the interconnection layer 200 and the light transmission layer 300, and a support substrate 230 may be bonded to a surface of the interconnection layer 200 opposite the semiconductor layer 100. Further, an interconnection substrate 400 may be attached to a surface of the support substrate 230 opposite the interconnection layer 200.

The interconnection substrate 400 may include a printed circuit board (PCB), and a plurality of solder balls 410 may be attached to a lower surface of the interconnection substrate 400 opposite the support substrate 230. Connecting pads may be disposed on an upper surface of the interconnection substrate 400 opposite the solder balls 410.

The connecting pads of the interconnection substrate 400 may be electrically connected to the interconnection layer 200 by through via plugs. Thus, the output signals of the image sensor, which are generated by the incident light, may be transmitted to the external devices through the solder balls 410 of the interconnection substrate 400.

An image sensor package may include a transparent plate disposed on the micro lenses 300. The transparent plate may protect the image sensor chip, and an external light may penetrate the transparent plate to reach the image sensor chip.

Figure 21:
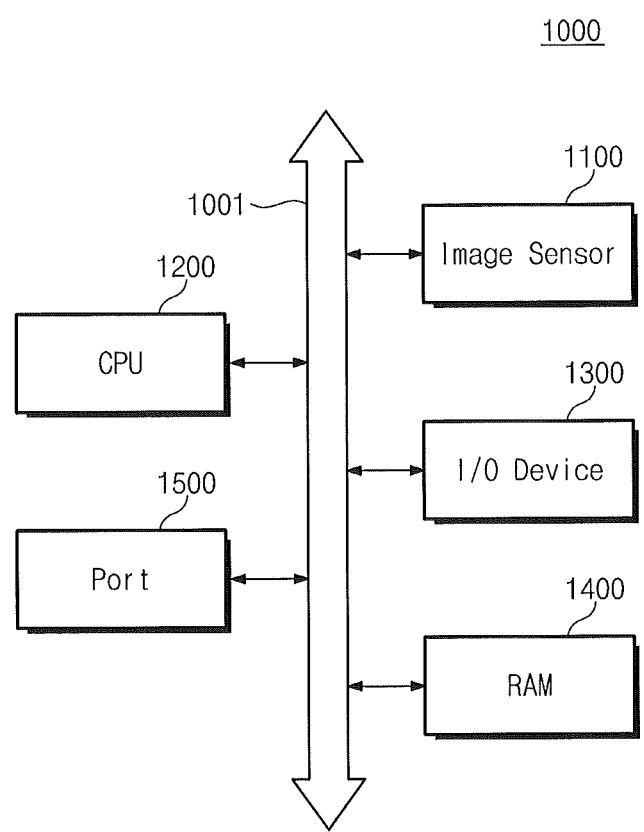
FIG. 21 is a schematic block diagram illustrating a processor-based system including an image sensor according to some embodiments.

FIG. 21 is a schematic block diagram illustrating a processor-based system including the image sensor according to some embodiments.

Referring to FIG. 21, the processor-based system 1000 is a system that processes output images of an image sensor 1100.

The system 1000 may include one of a computer system, a camera system, a scanner, a mechanical clock system, a navigation system, a video phone, a monitoring system, an automatic focus system, a tracking system, an operation monitoring system, and an image stabilizing system. However, the system 1000 is not limited thereto, but rather may include a variety of mechanical/electronic systems.

The processor-based system 1000, such as a computer system, may include a central processing unit (CPU) 1200, such as a microprocessor capable of communicating with an input/output (I/O) device 1300 via a bus 1001. The image sensor 1100 may communicate with the CPU 1200 and/or the I/O device 1300 via the bus 1001 or another communication link. The processor-based system 1000 may further include a memory (e.g., a random access memory (RAM)) 1400 and/or a port 1500 capable of communicating with the CPU 1200 through the bus 1001.

The port 1500 may be coupled with a video card, a sound card, a memory card, a USB device, or the like. Further, the port 1500 may be connected to an additional system to carry out data communication with the additional system. The image sensor 1100 may be integrated with a CPU, a digital signal processing device (DSP), or a microprocessor. Moreover, the image sensor 1100 may be integrated with a memory. Alternatively, the image sensor 1100 may be integrated in a chip different from that of a processor.

Figure 22:
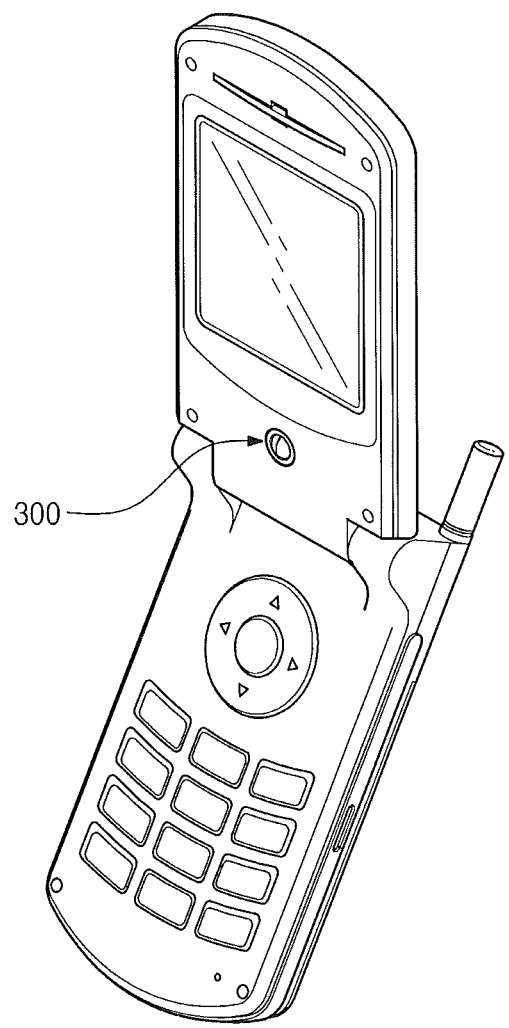
FIG. 22 is a perspective view illustrating an electronic product including an image sensor according to some embodiments.

FIG. 22 is a perspective view illustrating an electronic product including an image sensor according to some embodiments.

Referring to FIG. 22, the image sensor according to some embodiments may be applicable to mobile phones 2000. Further, the image sensor according to some embodiments may also be applicable to cameras, camcorders, personal digital assistants (PDAs), wireless phones, laptop computers, optical mouse, facsimile machines, or copying machines. In addition, the image sensor according to some embodiments may also be installed in telescopes, mobile phone handsets, scanners, endoscopes, fingerprint recognition systems, toys, game machines, household robots, or automobiles.

According to some embodiments, a transfer gate electrode and a floating diffusion region surrounded by the transfer gate electrode may overlap with a photoelectric conversion device in a plan view. Thus, there may be no need to arrange an extra planar area for the transfer gate electrode and the floating diffusion region in the plan view. As a result, the extra planar area that the transfer gate electrode and the floating diffusion occupy may be saved to improve/increase the integration density of an image sensor and/or to increase/maximize the area that the photoelectric conversion device occupy. Further, a portion of a P-type impurity layer constituting the photoelectric conversion device may be used as a channel region of a charge transmission element. Thus, a planar area of a unit pixel including the charge transmission element and the photoelectric conversion device may be reduced/minimized. This may lead to an increase of a fill factor of the image sensor.

In addition, the transfer gate electrode may be disposed at a central region of the photoelectric conversion device in a plan view. Thus, distances from the transfer gate electrode to all edges of the photoelectric conversion device may be substantially equal to each other. Therefore, when the charges generated from the photoelectric conversion device are transmitted into a detection device (e.g., the floating diffusion region), the electric field formed by a bias applied to the transfer gate electrode may be uniformly distributed throughout the photoelectric conversion device. As a result, all the charges stored in an N-type impurity region constituting the photoelectric conversion device may be easily and completely transmitted into the floating diffusion region. That is, a layout scheme of the transfer gate electrode disposed at the central region of the photoelectric conversion device may improve an undesirable "image lag" phenomenon which is due to the charges still left in the N-type impurity region of the photoelectric conversion device even after the activation of the charge transmission element.

Moreover, according to some embodiments, the transfer gate electrode may be disposed inside the semiconductor layer. That is, the N-type impurity layer of the photoelectric conversion device may be disposed to be sufficiently spaced apart from a surface of the semiconductor layer. This may significantly reduce/suppress generation of dark current and white spot in the image sensor.

While the inventive concept has been particularly shown and described with reference to various embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. An image sensor comprising:
   first and second stacked impurity regions having different conductivity types;
   a floating diffusion region in the first impurity region; and
   a transfer gate electrode surrounding the floating diffusion region in the first impurity region and not extending through the first impurity region, the transfer gate electrode and the floating diffusion region overlapping the second impurity region.

2. The image sensor of claim 1, wherein the transfer gate electrode has a closed-loop shape around the floating diffusion region.

3. The image sensor of claim 1, wherein the transfer gate electrode is substantially centered with respect to the second impurity region in a plan view.

4. The image sensor of claim 3, wherein:
   the first and second impurity regions provide a photoelectric conversion device; and
   first and second distances from the transfer gate electrode to respective first and second edges of the photoelectric conversion device are substantially equal.

5. The image sensor of claim 1, wherein:
   the first and second impurity regions share a boundary therebetween; and
   the transfer gate electrode is spaced apart from the boundary that is between the first and second impurity regions.

6. The image sensor of claim 1, wherein:
   the first and second impurity regions provide a photoelectric conversion device;
   the transfer gate electrode extends primarily vertically; and
   the transfer gate electrode is substantially centered with respect to the photoelectric conversion device in a plan view.

7. The image sensor of claim 1, further comprising a local impurity region adjacent the transfer gate electrode,
   wherein the local impurity region has the same conductivity type as the first impurity region, and
   wherein the local impurity region has an impurity concentration higher than that of the first impurity region.

8. The image sensor of claim 1, wherein:
   the first impurity region further comprises first and second layers having different impurity concentrations;
   the floating diffusion region is in the first layer; and
   the transfer gate electrode is in the first and second layers.

9. The image sensor of claim 1, wherein a portion of the first impurity region is configured to provide a channel region of a charge transmission element.

10. The image sensor of claim 1, wherein the first impurity region comprises:
    a surface impurity region; and
    an electric potential barrier region between the surface impurity region and the second impurity region,
    wherein the surface impurity region has an impurity concentration higher than that of the electric potential barrier region.

11. An image sensor comprising:
    a semiconductor layer having a first surface and a second surface that are opposite each other;
    a first impurity region of a first conductivity type formed in the semiconductor layer, the first impurity region adjacent to the first surface;
    a second impurity region of a second conductivity type formed in the semiconductor layer, the second impurity region adjacent to the second surface;
    a floating diffusion region in the first impurity region; and
    a transfer gate electrode surrounding the floating diffusion region in the first impurity region,
    wherein the transfer gate electrode is overlapped with the second impurity region, in a plan view.

12. The image sensor of claim 11, wherein the transfer gate electrode is spaced apart from the second surface of the semiconductor layer.

13. The image sensor of claim 11, wherein the transfer gate electrode has an opening exposing a portion of the first impurity region, and the floating diffusion region is formed in the portion of the first impurity region to be self-aligned with the opening of the transfer gate electrode.

14. The image sensor of claim 11, further comprising a gate insulating layer conformably covering a surface of the transfer gate electrode,
- wherein the floating diffusion region is in contact with a portion of the gate insulating layer.

15. The image sensor of claim 11, further comprising an isolation layer formed in the semiconductor layer to define a first active region and a second active region,
- wherein the transfer gate electrode is disposed on the first active region, and the first impurity region is in contact with the isolation layer.

16. The image sensor of claim 15, further comprising at least one reading device disposed on the second active region, the reading device electrically connected to the transfer gate electrode and the floating diffusion region.

\* \* \* \* \*